(12) United States Patent
Tanaka et al.

(10) Patent No.: US 6,617,265 B2
(45) Date of Patent: Sep. 9, 2003

(54) PHOTOMASK AND METHOD FOR MANUFACTURING THE SAME

(75) Inventors: Toshihiko Tanaka, Tokyo (JP); Norio Hasegawa, Hinode (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/927,318

(22) Filed: Aug. 13, 2001

(65) Prior Publication Data

US 2002/0052100 A1 May 2, 2002

(30) Foreign Application Priority Data

Oct. 27, 2000 (JP) ........................................ 2000-328159

(51) Int. Cl.$^7$ .............................................. H01L 21/31
(52) U.S. Cl. ...................... 438/782; 438/761; 438/778
(58) Field of Search ................................ 438/782, 761, 438/778, 780, 787, 789, 516, 526, 99, 22, 35, 28, 32, 39; 257/40

(56) References Cited

U.S. PATENT DOCUMENTS

| | | | | |
|---|---|---|---|---|
| 4,180,604 A | * | 12/1979 | Feng et al. | 427/270 |
| 4,204,009 A | * | 5/1980 | Feng et al. | 427/510 |
| 4,238,559 A | * | 12/1980 | Feng et al. | 427/273 |
| 5,028,292 A | * | 7/1991 | Incremona et al. | 156/272.6 |
| 5,178,989 A | * | 1/1993 | Heller et al. | 216/48 |
| 5,328,560 A | * | 7/1994 | Hanawa et al. | 430/313 |
| 5,832,595 A | * | 11/1998 | Maruyama et al. | 228/56.3 |
| 5,953,587 A | * | 9/1999 | Forrest et al. | 257/40 |
| 6,133,163 A | * | 10/2000 | Tanaka et al. | 438/761 |
| 6,297,516 B1 | * | 10/2001 | Forrest et al. | 257/103 |
| 6,358,664 B1 | * | 3/2002 | Nirmal et al. | 430/200 |

FOREIGN PATENT DOCUMENTS

JP          05-289307          4/1992

* cited by examiner

Primary Examiner—Carl Whitehead, Jr.
Assistant Examiner—Laura M Schillinger

(57) ABSTRACT

A resist mask having a satisfactory resolution effect may be obtained even in the case of use of exposure light having a wavelength of 200 nm or more. An opaque pattern 2a comprising an organic layer for transferring a pattern is constituted by a multi-layer formed by a photo-absorptive organic layer 3a having an light shielding effect or a light attenuating effect even relative to exposure light having a wavelength of 200 nm or more, and a resist layer 4a for chiefly patterning this.

14 Claims, 13 Drawing Sheets

PHOTOMASK AND METHOD FOR MANUFACTURING THE SAME

BACKGROUND OF THE INVENTION

The invention relates to a method of manufacturing a photomask and a photomask technology, and in particularly to a photomask technology that is effectively applicable to a photomask to be used for photolithography (to be referred to simply as lithography hereinafter) when a predetermined pattern is transferred onto a semiconductor wafer (to be referred to simply as wafer hereinafter).

In methods of manufacturing semiconductor integrated devices, a lithography technology has been used as methods of transferring fine patterns onto wafers. A projection exposure apparatus has been chiefly used in the lithography technology. The pattern of the mask fitted to the projection exposure apparatus is transferred onto a wafer to form a device pattern.

Normal masks are manufactured by processing metal films or inorganic films formed on a transparent mask plate. The metal films have a light blocking effect such as chromium (Cr) or the like. The inorganic films have a light reduction effect or a light blocking effect such as MoSi, ZrSiO, SiN or the like. That is, the above-mentioned ordinary masks are constituted by forming the above-mentioned metal films or inorganic films in desired shapes.

These metal films or inorganic films are normally formed by a sputtering method. The metal films are processed, for example, in a manner as follows. That is, firstly, after a resist film is applied on a metal film, a desired pattern is drawn on the resist film. Subsequently, after resist patterns having a desirable shape are formed by development, the resist patterns are used as a masking layer, and a metal film is processed by dry etching or wet etching. Thereafter, the resist patterns are removed, and cleaning or the like is performed, and the light blocking effect comprising the above-mentioned metal film having a desired shape is formed on a transparent mask plate. An inorganic film is also formed in the same manner.

SUMMARY OF THE INVENTION

However, the mask with such the constitution has problems of requiring many manufacturing processes and increasing manufacturing costs thereof. For the purpose of simplicity and lower costs of processes of manufacturing a mask, Japanese Patent Laid-open No. 5-289307 discloses a so-called resist mask method of forming a light shielding film by using a resist film. This method utilizes such a characteristic that an ordinary electron beam sensing resist film or a photosensitive resist film blocks vacuum ultraviolet light having a wavelength of about 200 nm or less. This method does not need the steps of etching light shielding films and of removing resist films, so that it is possible to reduce manufacturing costs of masks and diminish TAT by simplicity of the manufacturing steps. In recent years, as competition for developing semiconductor integrated circuit devices promotes, a plurality of masks is required for acceleration of device debug so that there has arisen needs for manufacturing the masks by low costs. There has also arisen needs for making the masks during TAT (Turn Around Time). Particularly, these needs increase because demand of a minority of various LSIs (Large Scale Integrated circuit) increases. From these views, manufacture of the masks in a short period and reduction of costs thereof are required further.

Meanwhile, in the above-mentioned resist mask technique, inventors of the present invention have found the following drawbacks.

That is, since the light shielding resist film of the above-mentioned resist mask can not obtain satisfactory light blocking effect against light beam having a wavelength of 200 nm or more, there arises a problem of obtaining no satisfactory resolution of the above-mentioned resist mask in exposure treatment using exposure light having a wavelength of 200 nm or more.

An object of the present invention is to provide a technique in which a resist mask having satisfactory resolution can be obtained.

The above object and other objects of the present invention and the novel features of the present invention will become apparent from description of the present specification and the accompanying drawings.

Some of the aspects of the present invention will be briefly summarized below.

According to the invention, a multi-layer attenuation pattern comprising a first organic layer having an attenuation effect relative to light for exposure and a second organic layer having a photosensitive effect relative to light for exposure is formed on a mask plate.

According to the invention, the phase of light for exposure transmitted through the attenuation pattern forming region is inverted relative to the phase of light exposure transmitted through the open regions devoid of the attenuation pattern.

According to the invention, a multi-layer attenuation pattern comprising a first organic layer having a light shielding effect relative to light for exposure and a second organic layer having a photosensitive effect relative to light for exposure is formed on a mask plate.

According to the invention, there is provided a method of manufacturing a photomask having an attenuation pattern and having a multi-layer structure of first and second organic layers, said method comprises: a step of depositing a first organic layer having an attenuation effect relative to light for exposure on a mask plate; a step of depositing a second organic layer having a photosensitive effect relative to light for exposure on the first organic layer; a step of exposing the second organic layer to light with a desired pattern; a step of patterning the second organic layer by developing the second organic layer; and a step of forming an attenuation pattern by patterning the first organic layer, using the patterned second organic layer as masking pattern.

According to the invention, there is also provided a method of manufacturing a photomask having an opaque pattern and having a multi-layer structure of first and second organic layers, said method comprises: a step of depositing a first organic layer having a light shielding effect relative to light for exposure on a mask plate; a step of depositing a second organic layer having a photosensitive effect relative to light for exposure on the first organic layer; a step of exposing the second organic layer to light with a desired pattern; a step of patterning the second organic layer by developing the second organic layer; and a step of forming an opaque pattern by patterning the first organic layer, using the patterned second organic layer as masking pattern.

Further, a photomask is constituted as follows.

(1). A photomask characterized in that an attenuation pattern formed on a mask plate comprises a multi-layer formed by a first organic layer having an attenuation effect relative to exposure light, and a second organic layer having a photosensitive effect relative to exposure light to be used formed a mask pattern.

(2). The photomask according to item (1), wherein an attenuation pattern comprising the multi-layer formed by said first and second organic layers, and an opaque pattern comprising a metal layer are provided in a pattern transferring region of said mask plate.

(3). The photomask according to item (1), wherein if refractive index of said second organic layer to exposure light having a wavelength of λ is n1, and that of the first organic layer is n2, and a film thickness of said second organic layer is d1, and that of said first organic layer is d2, then one of $$5/4 \leq [(n1-1)d1+(n2-1)d2]/\lambda \leq 7/4$$

and $$9/4 \leq [(n1-1)d1+(n2-1)d2]/\lambda \leq 11/4$$

is satisfied.

(4). A photomask characterized in that an opaque pattern formed on a mask plate comprises a multi-layer formed by a first organic layer having an opaque effect relative to exposure light, and a second organic layer having a photosensitive effect relative to exposure light to be used for exposing a mask pattern.

(5). The photomask according to item (4), wherein an opaque pattern comprising the multi-layer formed by said first and second organic layers, and an opaque pattern comprising a metal layer are provided in a pattern transferring region of said mask plate.

(6). The photomask according to item (4), wherein extinction coefficient is 0.02 or more relative to the exposure light of said first organic layer.

(7). A photomask characterized in that an attenuation pattern formed on a mask plate comprises a multi-layer formed by a first organic layer having an attenuation effect relative to exposure light and by a second organic layer having a photosensitive effect relative to exposure light to be used for exposing a mask pattern, and an end portion of the pattern of said second organic layer hangs longer than an end portion of the pattern of said first organic layer.

(8). The photomask according to item (7), wherein if refractive index of said second organic layer relative to exposure light having a wavelength of λ is n, a thickness d of said second organic layer satisfies $$\lambda/(4(n-1)) \leq d \leq 3\lambda/(4(n-1)).$$

(9). The photomask according to item (8), wherein if reduction ratio of a projection lens in an exposure apparatus is 1/M, an overhang amount of said second organic layer is between 0.05/M(μm) and 0.15/M(μm).

(10). The photomask according to item (1), wherein said first organic layer has a characteristic of absorption of exposure light having a wavelength of 200 nm or more.

(11). The photomask according to item (1), wherein said exposure light is one of a KrF excimer laser beam, an i-line of an ultra high pressure mercury lamp, and a g-line of an ultra high pressure mercury lamp.

(12). The photomask according to item (1), wherein an opaque pattern comprising a metal layer is provided in an outer peripheral region of the pattern transferring region of said mask plate.

(13). The photomask according to item (12), wherein a mark pattern is formed by a light transmitting pattern formed by cutting a portion of the opaque pattern formed of said metal layer.

(14). The photomask according to item (13), wherein said mark pattern is a reticle alignment mark indicating a position of a photomask to an exposure apparatus.

(15). The photomask according to item (1), wherein said first and second organic layers are provided so as not to be arrayed in a portion contacting to the other device on said mask plate.

(16). The photomask according to item (1), wherein said first organic layer is electrically conductive.

(17). The photomask according to item (16), wherein said first organic layer contains polyaniline.

42. A photomask for exposure, which has a transparent substrate and an attenuation layer for attenuating exposure light, a desired pattern being formed in said attenuation layer, the photomask characterized in that said attenuation layer is formed by sequentially laminating a photo-absorptive organic layer and a photosensitive organic layer, and that light absorbance relative to exposure light of said photo-absorptive organic layer is higher than that of said photosensitive organic layer.

(19). A photomask for exposure, which has a transparent substrate and an attenuation layer for attenuating exposure light, a desired pattern being formed in said attenuation layer, the photomask characterized in that said attenuation layer is formed by sequentially laminating a photo-absorptive organic layer and a photosensitive organic layer, and that if refractive index of said resist layer relative to exposure light having a wavelength of λ is n, then a thickness d of said photosensitive organic layer satisfies $$\lambda/(4(n-1)) \leq d \leq 3\lambda/(4(n-1)).$$

(20). The photomask according to item (19), wherein a width of the pattern of said photo-absorptive organic layer is smaller than that of said photosensitive organic layer, and wherein an end portion of the pattern of said photosensitive organic layer hangs over a rim portion of said desired pattern.

(21). The photomask according to item (20), wherein if reduction ratio of a projection lens in an exposure apparatus is 1/M, an overhang amount of said photosensitive organic layer is between 0.05/M(μm) and 0.15/M(μm).

DESCRIPTION OF THE PREFERRED EMBODIMENTS

Figure 1:
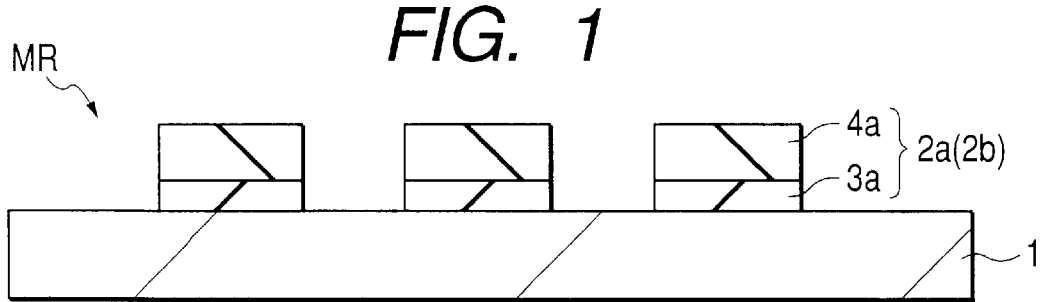
FIG. 1 is a cross-sectional view of a principal part of a photomask that is one embodiment of the present invention.

Before describing the present invention in detail, some of the technical terms used in the specification will be defined below.

1. Mask (optical mask): This is one that a pattern for shading light or for shifting phase of light is formed on a mask plate. It includes a reticle in which a pattern with dimensions several times greater than actual dimensions is formed. A first main surface of the mask means a patterned surface where a pattern for shading light mentioned above or for shifting the phase of light is formed. A second main surface of the mask means a surface (that is, a rear surface) of an opposite side of the first main surface of the mask.

2. Ordinary mask or binary mask: This is included in a kind of the above-mentioned mask, and means a general mask in which mask patterns are formed on the mask plate by an attenuation pattern comprising a metal film and a light transmitting pattern.

3. Resist mask: This is included in a kind of the above-mentioned mask, and means a mask having an attenuation body (light shielding film, attenuation pattern or light shielding region) comprising an organic film on the mask plate.

4. The patterned surface of a mask (the above-mentioned ordinary mask and resist mask) is divided into the following regions. That is, a "pattern transferring region" means a region in which an integrated circuit pattern and the like to be transferred, and a "peripheral region" means a region surrounding the outer periphery thereof.

5. A "light reducing region", a "light reducing film" or a "light reducing pattern" means having an optical characteristic that transmits 25% less than exposure light illuminated in the region. Generally 15% less than the exposure light is used. An "attenuation region", an "attenuation film" or an "attenuation pattern" means an optical characteristic that transmits 2% less than exposure light illuminated in the region. Generally 1% less than the exposure light is used. A "transparent region", a "transparent film" or a "light transmitting pattern" means an optical characteristic that transmits 60% more than exposure light illuminated in the region. Generally 90% more than the exposure light is used.

6. If extinction coefficient of an organic layer relative to exposure light is k, a wavelength of exposure light is λ, and absorbance is α, then k is expressed by the equation of $$k=(\lambda/4\pi)\alpha \cdot ln_e 10.$$

If transmittance of the organic layer is T and a film thickness thereof is d, then T is expressed by the equation of $$T=\exp(-4\pi k d/\lambda).$$

In the case where the organic film are formed by a laminating film comprising an absorptive organic film and a resist film, T is expressed by the equation of $$T=\exp(-4\pi k1 d1/\lambda) \times \exp(-4\pi k2 d2/\lambda),$$

where k1 is an extinction coefficient of the absorptive organic film, and d1 is a film thickness of the absorptive resist film, and k2 is an extinction coefficient of the resist film, and d2 is a film thickness of the resist layer.

7. Transferred pattern: This is a pattern transferred onto a wafer by a mask, and, more specifically, means a pattern actually formed on the wafer by using a photoresist pattern and as a mask.

8. A photoresist pattern means a film pattern that patterns a photosensitive organic film by a method of photolithography. A simple resist film entirely having no opening relative to a corresponding portion is included in this pattern. There is an electron beams, X rays or charged particle rays besides light as a photosensitive ray source. Something containing inorganic materials such as silicon (Si) or the like in addition to something consisting of only organic materials is included as a photosensitive organic film.

9. Ordinary illumination: This means unmodified illumination and illumination in which intensity distribution of light from a secondary light source is relatively uniform.

10. Modified illumination: This means illumination in which illuminance of a central part of the secondary light source is reduced and includes oblique illumination, annular-looped illumination, multiple pole illumination such as quadruple pole illumination or quintuple pole illumination or the like, or a super resolution technology using a pupil filter equivalent thereto.

11. Scanning exposure: This is an exposure method of transferring a circuit pattern provided on a mask, onto a desired portion of a wafer, by continuously moving (scanning) a narrow slot-shaped exposure belt in a direction perpendicular (or oblique) to a longitude direction of the slot relative to both the wafer and the mask. A device performing such the exposure method is referred to as a scanner.

12. Step and repeat exposure: This is an exposure method for transferring a circuit pattern provided on a mask, onto a desired portion of a wafer, by repeatedly stepping the wafer relative to projected images of the circuit pattern on the mask. A device performing such the exposure method is referred to as a stepper.

If advantageously needed in embodiments described below, the invention will be divided into a plurality of sections and embodiments and be explained. And, except for particularly specifying cases, they have nothing to do with one another but one of them has something to do with modifications, detailed explanation, supplementary explanation, or the like relative to one portion or entire of the other.

Further, in the embodiments described below, except for a case of citation of number of elements or the like (containing number of elements, a numerical value, a quantity, a numerical range or the like), a case of particular specification, a case of limit to specific numbers positively and in principle, and the like, the present invention is not limited to the specific number and may be more than or less than or equal to the specific number.

Further, in the embodiment described below, it goes without saying that components (including processing steps or the like) thereof is not always indispensable to the present invention except for a case of particular specification and a case of what is thought of as indispensable positively and in principle, and the like.

Similarly, in the embodiment described below, cases of citation of shapes of components or the like, or/and positional relationships or the like include something that is in fact close or similar to the shapes or the like except for a case particular specification, and a case of what is not thought of as indispensable positively and in principle, and the like. This is also the same about the above-mentioned numeral values and ranges.

And, throughout the accompanying drawings for describing the present embodiments, components having the same function are denoted by the same reference symbol, and repetition thereof will be not omitted.

Additionally, in the drawings used in description of the present embodiments, light shielding portions (including light shielding films, light shielding patterns, light shielding regions, and the like) and resist films are hatched for the purpose of easy understanding the drawings even in top views.

Now, embodiments of the present invention will be described in detail by referring to the accompanying drawings.

Embodiment 1

Firstly, problems of resist mask having been found first by study of the inventors of the present invention will be described. Chemical formula of a representative electron beam sensing resist resin that the inventors have studied is shown below.

Chemical Formula 1

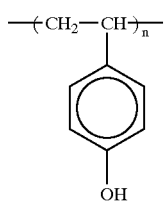

Figure 14:
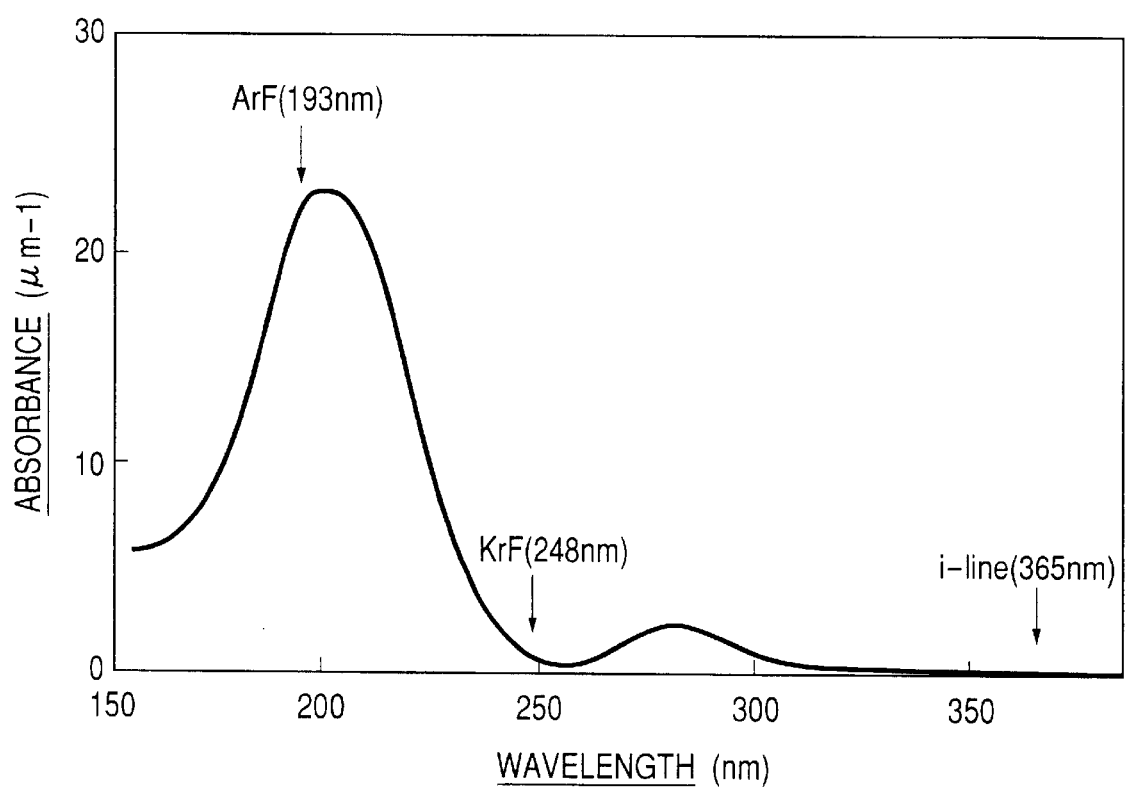
FIG. 14 is a graph illustrating the photo-absorptive characteristic of a single resist layer studied by the inventors of the present invention.

And, a spectral absorption characteristic of this resin is illustrated by FIG. 14. As seen from FIG. 14, this drawing shows remarkable absorption having an absorbance of 20/μm or more relative to ArF excimer laser beams having a wavelength of 193 nm, and then shows an absorbance of 1 μm or less relative to KrF excimer laser beams having 248 nm and to an i-line of a super high pressure mercury lamp having a wavelength of 365 nm, so that satisfactory light blocking effect is not obtained. Currently, a KrF excimer laser exposure apparatus with a wavelength of 248 nm is used for exposure that is state-of-the-art and has a high added value, and i-lines with a wavelength of 365 nm or g-lines with a wavelength of 436 nm is used for rough processes and low costs processes that has comparatively loose dimensional accuracy. Therefore, there is a serious problem of restriction for this exposure wavelength within a range applicable to a resist mask.

Thereupon, in the present embodiment, a light shielding pattern is formed by an organic film structure that provides a satisfactory light blocking effect relative to exposure light having a wavelength of 200 nm or more such as KrF excimer laser beams, i-lines, g-lines or the like. Concrete explanation thereof will be made below.

FIG. 1 shows a basically sectional structure of a resist mask MR of the present embodiment. A mask plate 1, for example, is made of transparent fused silica, and an opaque pattern 2a (or a half-tone pattern (attenuation pattern) 2b as will be described hereinafter by referring to Embodiment 2) made of an organic layer is formed in a pattern transferring region of a first main surface thereof. In this embodiment, the opaque pattern 2a (or the half-tone pattern 2b) comprises a photo-absorptive organic layer (a first organic layer) 3a and a resist layer (a second organic layer) 4a laid on the photo-absorptive organic layer 3a. This arrangement structurally differs from the arrangement disclosed in Japanese Patent Laid-open No. 5-289307 in that the opaque pattern 2a (or the half-tone pattern 2b) has a multi-layer structure comprising a photo-absorptive organic layer 3a and a resist layer 4a.

Figure 2A:
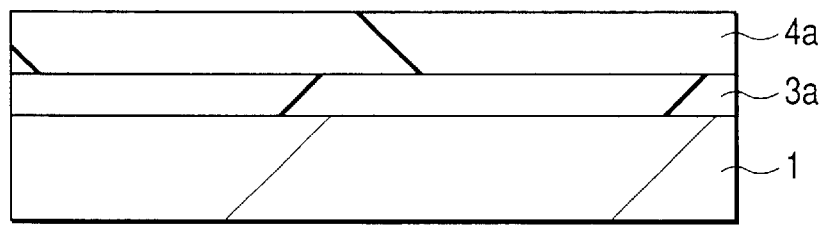
FIG. 2(a) is a cross-sectional view of a principal part during a manufacturing step of the photomask of FIG. 1.
Figure 2B:
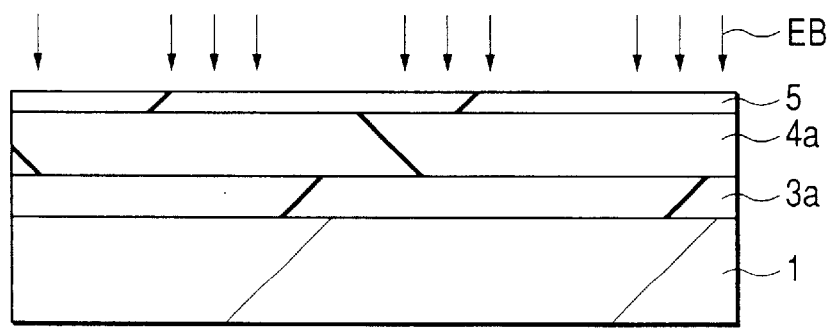
FIG. 2(b) is a cross-sectional view of a principal part during a manufacturing step of the photomask of FIG. 1.
Figure 2C:
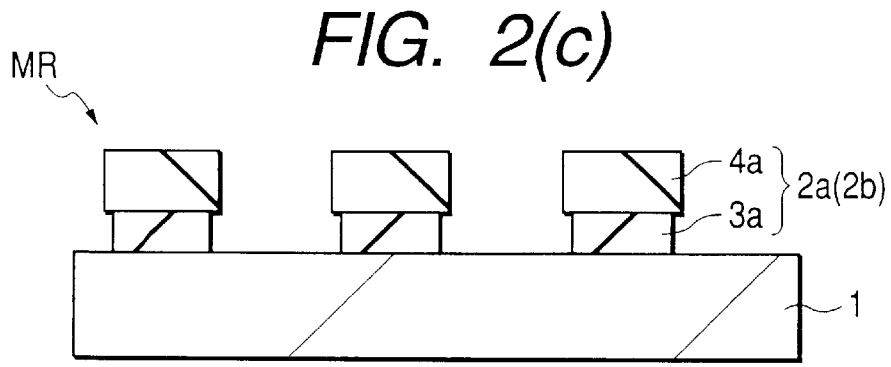
FIG. 2(c) is a cross-sectional view of a principal part during a manufacturing step of the photomask of FIG. 1.

Now, a method of manufacturing the resist mask MR will be described by referring to FIGS. 2(a) through 2(c). FIGS. 2(a) through 2(c) are cross-sectional views of a principal part of the pattern transferring region during a manufacturing step of the resist mask MR. It is noted that formation of the opaque pattern 2a will be described, and formation of the half-tone pattern 2b will be described by Embodiment 2 described hereinafter.

Firstly, as shown in FIG. 2(a), a photo-absorptive organic layer 3a is applied to the first main surface of the mask plate 1 and then is baked. Subsequently, an electron beam sensing type resist layer 4a is applied onto the photo-absorptive organic layer 3a. As the photo-absorptive organic layer 3a in this, for example, a material of a polyimde type that remarkably absorbs KrF excimer laser beams is used. The material of this photo-absorptive organic layer 3a can be dissolved in a solution of tetramethyl ammonium hydroxide (TMAH). A photo-absorptive agent effective for KrF excimer laser beams has been added to the photo-absorptive organic layer 3a. Alternatively, the photo-absorptive agent may be chemically bonded to the polyimide. Being bonded to the polyimide has such a characteristic that the photo-absorptive agent is difficult to decompose, and resistance to illumination of laser beams is increased. The extinction coefficient (an imaginary part of complex refractive index) of the photo-absorptive organic layer 3a relative to KrF excimer laser beams is 0.58. The photo-absorptive organic layer 3a plays a role of attenuation or opaqueness of the exposure light. The photo-absorptive organic layer is used because the use of only a photosensitive organic layer (a resist layer 4a) does not provide a satisfactory attenuation effect. Therefore, the extinction coefficient of the photo-absorptive organic layer 3a relative to the exposure light needs to be higher than that of the photosensitive organic film. After s baking process, the photo-absorptive organic layer 3a has a film thickness, for example, of about 0.2 μm. For example, the baking process has a temperature of 180° C. The baking temperature needs to be accurately controlled because the solubility of the photo-absorptive organic layer 3a in TMAH depends highly thereon.

An acid catalytic reaction type chemical amplification positive resist layer prepared by using a phenol resin as a base resin is used for the electron beam sensing type resist layer 4a. The extinction coefficient of the resist layer 4a relative to the KrF excimer laser beams is about 0.03, for example. A novolak resin or an acrylic resin may be used as a base resin. Sensitiveness thereof is inferior to a chemical amplification type resist layer, but, for example, non-chemical amplification type resist layer such as a resist consisting of naphthoquinone diazide and a novolak resin, or a resist consisting of 2-methylpentene-1-sulfone and a novolak resin, or the like may be also used. These non-chemical amplification type resist layers have such superior characteristics that abnormality of interfacial shapes between the photo-absorptive organic layer 3a and it is difficult to cause, and that there is abundance in stable atmosphere, and that dependence on time needed between exposure and development is weak, and the like.

Subsequently, these layers are applied, and then are set at a foreign object checking apparatus, and are checked therein. If respective foreign objects larger than a predetermined reference size have been detected for the number of foreign objects more than a predetermined reference, the resist layer 4a and the photo-absorptive organic layer 3a are striped, and cleansed to regenerate mask blanks (to be referred to simply as blanks hereinafter). Then, applying the photo-absorptive organic layer 3a and the resist layer 4a is repeated. This process is not particularly restricted. But, for example, when exposure treatment is performed, if respective foreign objects and defects having a size of 0.2 μm or more and having 2 or more to be transferred are detected, regeneration is performed. In the present embodiment, the opaque pattern 2a is constituted not by a metal layer such as a chromium layer or the like formed by a sputtering method in a vacuum apparatus but by an organic layer formed by an applying method, so that rate of defective foreign objects can be achieved up to 5% or less. A solution having a TMAH of 5% or more in concentrations is used for peeling off the resist layer 4a and the photo-absorptive organic layer 3a during the above-mentioned regeneration. Use of the TMAH can easily deal with waste solution. Alternatively, striping may be performed by an organic solvent such as acetone or n-methyl-2-pyrrolidone or the like, or ozone sulfonic acid, or an amine type resist stripper, or oxygen ($O_2$) plasma, or the like.

Then, as shown in FIG. 2(b), a conductive layer 5 having conductivity is applied onto the photo-absorptive organic layer 3a, and a desired pattern is drawn by electron beams EB. A water-soluble conductive layer is used as the conductive layer 5. Use of the conductive layer 5 can prevent charge-up in drawing the pattern by electron beams, and thereby prevent shift of the drawn pattern generated by the charge-up. Since the mask plate 1 is made of insulative quartz glass (fused silica) and materials for forming the opaque pattern 2a are also insulative materials, this charge-up results in effective prevention very much. It is found that the charge-up can be prevented when the electric resistance holds an electric conductivity of 50 $M\Omega/cm^2$ or less. Thereafter, the electron beam sensing type resist layer 4a is baked and developed by a developing solution of TMAH to produce a resist pattern shown in FIG. 2(c) in the resist layer 4a. At the same time, the photo-absorptive organic layer 3a is also patterned during this developing process. Process for the photo-absorptive organic layer 3a is a kind of wet etching process and is etched on a flat surface, so that over-etching amounts can be held as low as 20%. Thus, since side etching amounts can be suppressed to 30 nm or less, an excellent intra-planar uniformity is provided. That is, although side etching occurs to a slight extent at both side surfaces of the photo-absorptive organic layer 3a, the pattern transferred by the exposure treatment has no problem particularly. However, for example, in the case where the fine pattern is transferred or the like, it is likely that dimensions of the transferred pattern will change due to the side etching of the photo-absorptive organic layer 3a. If the dimensions are changed, the resist layer 4a may be predetermined by planar dimensions greater than required dimensions because a backing amounts (side etching amounts) of photo-absorptive organic layer 3a are estimated due to the side etching.

Figure 3A:
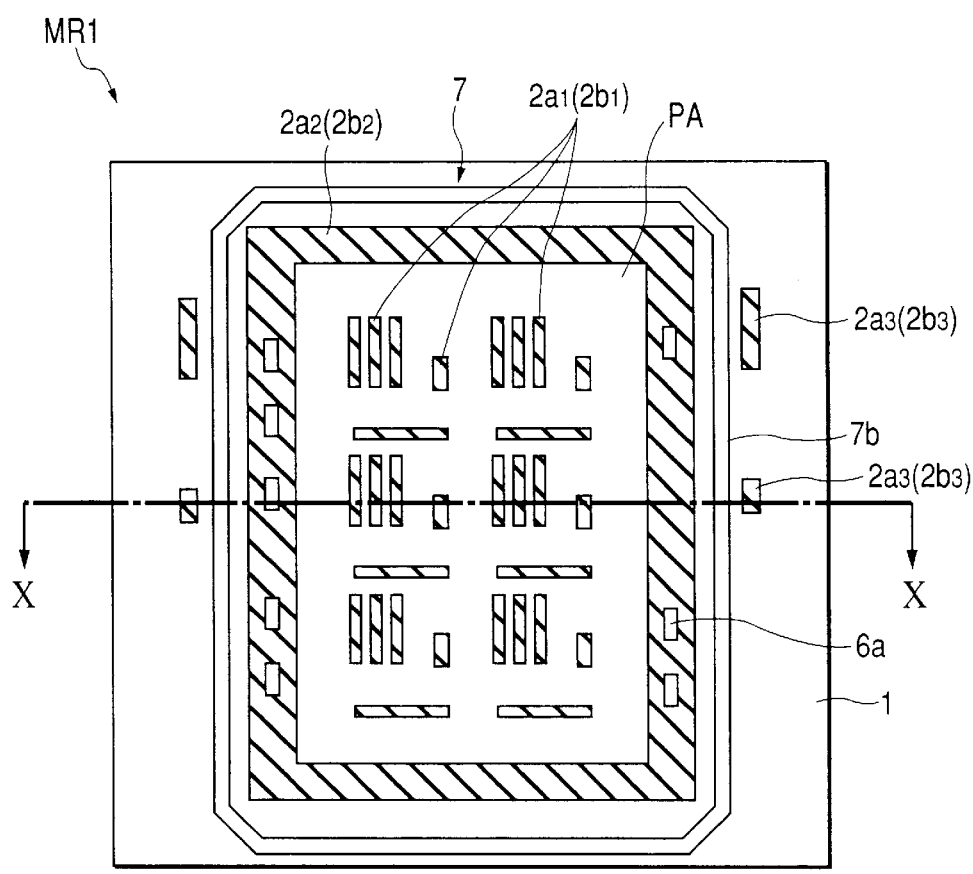
FIG. 3(a) is an entire plan view of a concrete example of a photomask that is one embodiment of the present invention.
Figure 3B:
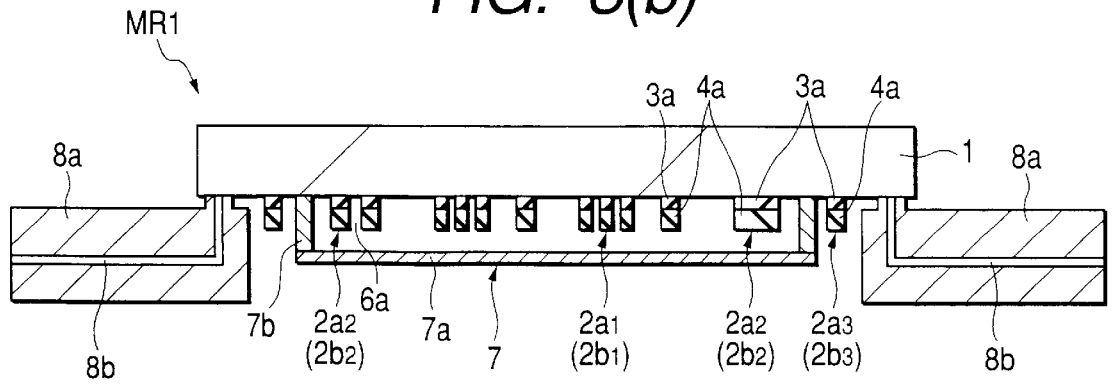
FIG. 3(b) is a cross-sectional view taken along line X—X in FIG. 3(a) when the photomask is set at an exposure apparatus.

FIGS. 3(a) and 3(b) show an example of overall constitutions of this resist mask MR1. FIG. 3(a) is a plan view of an entire resist mask MR1, and FIG. 3(b) is a cross-sectional view taken along line X—X in FIG. 3(a) when the resist mask MR1 is set at an exposure apparatus.

This resist mask MR1 illustrates a reticle to be used for transferring an integrated circuit pattern that is dimensionally 1 to 10 times larger than the actual dimension, onto a wafer or the like mainly made of single crystal silicon by a reduction projection optical system or the like. The mask plate 1 is formed, for example, like a plane rectangle shape, and a plurality of opaque patterns 2a1 are arrayed in a plane-rectangle-shaped pattern transferring region PA located at the center of a first main surface thereof. These opaque patterns 2a1 are patterns for illustrating a kind of opaque pattern 2a described above, and are formed by a multi-layer comprising the photo-absorptive organic layer 3a and the resist layer 4a similarly to the opaque pattern 2a. These opaque patterns 2a1 are pattern for transferring the integrated circuit pattern.

A belt-shaped opaque pattern 2a2 surrounds the outer periphery of this pattern transferring region PA. This belt-shaped opaque pattern 2a2 are patterns for illustrating another kind of opaque pattern 2a, and are formed by a multi-layer comprising the photo-absorptive organic layer 3a and the resist layer 4a like the opaque pattern 2a. However, the opaque pattern 2a2 is not used for transferring the integrated circuit pattern, and is formed in a region corresponding to a cutting region such as a scribing region or a dicing region provided on the wafer. A plurality of transparent patterns 6a is arrayed in the belt-shaped opaque pattern 2a2. These transparent patterns 6a operate as wafer alignment marks to be used for aligning different layers and are formed by removing one portion of the opaque pattern 2a2. Also, a plurality of opaque patterns 2a3 is formed in the outer periphery of the belt-shaped opaque pattern 2a2. These opaque patterns 2a3 are patterns for illustrating still another kind of opaque pattern 2a, and are formed by a multi-layer comprising the photo-absorptive organic layer 3a and the resist layer 4a like the above-mentioned opaque pattern 2a. These opaque patterns 2a3 operate as reticle alignment marks for accurately positioning a mask. Additionally, a pellicle 7 is provided on the first main surface of the mask plate 1. The pellicle 7 is a member having a pellicle film 7a in order to protect the resist mask MR1 against foreign objects and prevent the foreign objects from being transferred onto the wafer with ease, and has a frame section 7b directly fitted to the mask plate 1.

Such the resist mask MR1 is placed with the first main surface of the mask plate 1 being faced to a reticle stage 8a of the exposure apparatus, and, for example, is held by vacuum absorption. A reference number 8a denotes a vacuum absorption tube. What is important here is that the photo-absorptive organic layer 3a and the resist layer 4a are not provided in areas of the resist mask MR1, in which the reticle stage 8a and the members of the reticle transporting system or the like are in contact with the resist mask MR1. This array is required because organic substances on the resist mask MR1 including those of the photo-absorptive organic layer 3a and the resist layer 4a can be striped to become foreign objects if such substances are found in those areas where the above mentioned members are in contact with the resist mask MR1 as such organic substances are fragile in comparison with metal. With the array that the areas of the resist mask MR1 where the above mentioned members being in contact with the resist mask MR1 are devoid of organic substances, any production of foreign objects. Hence, defective transfer due to foreign objects can be effectively prevented from occurring. Therefore, a highly reliable mask can be provided.

Meanwhile, in the exposure treatment, light is illuminated onto a second main surface of the mask plate 1 from above in FIG. 3(b) so that the wafer is irradiated with and exposed to light by way of the mask plate 1 and a projection lens of the exposure apparatus located below the first main surface of the mask plate 1. In other words, exposure lighte is shed in the direction from the side of the photo-absorptive organic layer 3a to that of the resist layer 4a. Although the photo-absorptive organic layer 3a may easily be destructed when illuminated with light, the resist layer 4a formed on the photo-absorptive organic layer 3a limits the passage of reactive gas such as oxygen to and from the photo-absorptive organic layer 3a to minimize the adverse effect on the resistance against light of the photo-absorptive organic layer 3a. In short, the resist layer 4a operates as a sort of protection layer for the photo-absorptive organic layer 3a. As a result, it is possible to improve the resistance of the photo-absorptive organic layer 3a against irradiation of and exposure to light.

The transmittance of the opaque patterns 2a1 through 2a3 (the multi-layer film comprising the photo-absorptive organic film 3a and the resist layer 4a) of the resist mask MR1 prepared in the above experiment relative to KrF excimer laser beams was 0.2% to prove that it operated effectively as light shielding member. The opaque patterns 2a1 through 2a3 could be striped by means of aqueous solution containing TMAH by 5% or more than an organic solvent such as acetone or n-methyl-2-pyrrolidone, ozone sulfonic acid, an amine type resist stripper or oxygen ($O_2$) plasma so that the mask plate 1 could be reused as blank after cleansing. The fact that the mask plate 1 is reusable is one of the advantages of the resist mask from the viewpoint of cost and friendliness to the environment.

While positive resist is used for the resist layer 4a of the opaque pattern 2a1 through 2a3 in this embodiment, negative resist may also be used for the purpose of the invention. The use of negative resist can simplify the process of manufacturing the resist mask MR1 because the use of positive resist involves a side edge rinsing step and an edge expose step for removing the resist layer 4a from the periphery of the first main surface of the mask plate 1 for the patterning operation of producing the opaque patterns 2a1 through 2a3, whereas the use of negative resist does not require such steps. It may be noted here that cross-linking type negative resist shows a strong resistance to irradiation of and exposure to light.

The resist mask MR1 was fitted to a KrF excier stepper whose lens showed a numerical aperture (NA) of 0.6 and a reduction ratio of 1/5 and the desired pattern formed on the resist mask MR1 was transferred onto the positive type resist layer applied to the wafer by exposing the pattern to ordinary light. As a result a micro-wiring pattern of 0.16 µm could be successfully transferred without any transfer defects. Since the attenuation coefficient of the photo-absorptive organic layer 3a was 0.58, it will be appreciated that the photo-absorptive organic layer played a major role in shielding the light irradiated for exposure. A layer having a large attenuation coefficient theoretically reflects light at the surface thereof to a large extent. Reflected light strays in the exposure apparatus to reduce the resolution. However, the configuration of this embodiment where a resist layer 4a having a small attenuation coefficient is laid on the upper surface of the photo-absorptive organic layer 3a having a large attenuation coefficient provides a remarkable advantage of reducing harmful reflected light.

Thus, the above described embodiment provides the following advantages.

(1) The resist mask MR shows a satisfactorily high level of resolution even when exposed to light with a wavelength greater than 200 nm such as KrF excimer laser beams.

(2) The etching operation that is necessary when an opaque pattern is formed from a metal film, the operation of removing the resist film that is used for the etching operation and the accompanying cleaning operation can be omitted to significantly reduce the number of steps of manufacturing a mask.

(3) The TAT of manufacturing a mask can be remarkably reduced because of (2) above.

(4) When the opaque patterns are formed from a metal film, the metal film has to be coated typically by sputtering in a vacuum apparatus. On the other hand, the opaque patterns 2a1 through 2a3 are formed by means of an application process for this embodiment to eliminate the coating step so that consequently the fraction defective is reduced to raise the yield of mask manufacturing.

(5) As a result of forming the opaque patterns 2a1 through 2a3 from an organic film, the mask plate 1 carries thereon only the organic film so that it can be treated to regenerate a blank by means of an ashing system or a treatment using solvent. In other words, a mask can be regenerated with ease by using a used resist mask MR1 to save the precious natural resources.

(6) The cost of manufacturing a mask can be greatly reduced because of (2), (4) and/or (5) above.

Embodiment 2

While Embodiment 1 is described in terms of a so-called binary mask where the photo-absorptive organic layer has a thickness of about 0.2 µm and the pattern transferring region of the mask has only opaque areas and the transparent areas, this embodiment will be described in terms of a so-called half-tone type phase shifting mask where the pattern transferring region has translucent or half-tone areas.

A half-tone type phase shift mask is a mask having a layer that is translucent relative to light for exposure and formed on a mask plate (blank) (to be referred to as half-tone layer hereinafter). The transmittance of the half-tone layer relative to light for exposure is normally regulated to be between 1 and 25%. The thickness of the half-tone layer is regulated in such a way that the light transmitted through the region where the layer is formed shows a phase difference relative to the light for exposure transmitted through the open regions that are devoid of the film layer. It is known that the phase difference that gives rise to the highest resolution is equal to $\pi$ (180°). It is also known that, by using this technique, the contrast and hence the resolution of the transferred pattern can be improved by 5 to 20% because the phase of light for exposure is inverted along the boundaries of the half-tone layers and the open regions devoid of the film layer. Now, the resist mask of this embodiment will be described in greater detail by referring to the drawings that are also referred to when describing the first embodiment.

This embodiment comprises multi-layer half-tone pattern layers 2b (2b1 through 2b3), each comprising a photo-absorptive organic layer 3a and a resist layer 4a as shown in FIGS. 1 through 3. In an experiment conducted for this embodiment, the photo-absorptive organic layers 3a and the resist layers 4a were made to show respective thickness of about 75 nm and about 460 nm. The attenuation coefficient of the photo-absorptive organic layers 3a and that of the resist layers 4a relative to KrF excimer laser beams for exposure are 0.58 and 0.03 respectively. Therefore, the transmittance of the half-tone pattern 2b (2b1 through 2b3) comprising the photo-absorptive organic layers and the resist layers 4a is about 5.5%. Since the refractive index of the photo-absorptive organic layers 3a and that of the resist layers 4a relative to KrF excimer laser beams are respectively about 1.65 and about 1.7, the phase of the light for exposure transmitted through the half-tone pattern layers 2b (2b1 through 2b3) and that of the light transmitted through the open regions devoid of half-tone resist pattern 2b show a phase difference of about $3\pi$. Therefore, this resist mask provides a phase shifting effect when used for exposure to light.

The photo-absorptive organic film 3a of this embodiment that is to be processed by wet etching has a small thickness and hence the wet etching operation can be performed with an enhanced precision level. The photo-absorptive organic film 3a of this embodiment requires to show an attenuation coefficient of 0.2 or more because of the relationship between its film thickness necessary for achieving the light shielding effect and the wet etching process of the film. Generally, phase shifting masks are designed to provide a phase difference of $\delta$ and therefore, the embodiment may also be designed to provide a phase difference of $\pi$. However, according to the study of the inventors of the present invention, a phase shifting mask designed to provide a phase difference of $\delta$ and a transmittance of 6%, the photo-absorptive organic film 3a and the resist film 4a need to show respective a film thickness of about 90 nm and about 95 nm so that the resist film 4a is too thin relative to the photo-absorptive organic film 3a and, in many cases, cannot withstand the operation of processing the photo-absorptive organic film 3a, using developing solution. As a result of research efforts for overcoming the above identified problem that may be faced when preparing an embodiment of photomask according to the invention and examining the transfer performance thereof, it was found that the problem can be overcome if the refractive index of the resist film 4a and that of the photo-absorptive organic film 3a relative to light with a wavelength of $\lambda$ for exposure are respectively n1 and n2 and the film thickness of the resist film 4a and that of the photo-absorptive organic film 3a are respectively d1 and d2 and when $$5/4 \leq [(n1-1)d1 + (n2-1)d2]/\lambda \leq 7/4$$

(or the phase difference is $3\pi$) or $$9/4 \leq [(n1-1)d1 + (n2-1)\_i\ d2]/\lambda \leq 11/4$$

(or the phase difference is $5\pi$).

This embodiment of the invention provides the following advantage in addition to the advantages listed above for Embodiment 1.

A half-tone type phase shifting resist mask having a satisfactory resolution can be obtained even when light with a wavelength of 200 nm or less such as KrF excimer laser beams is used for the exposure process.

Embodiment 3

Figure 4A:
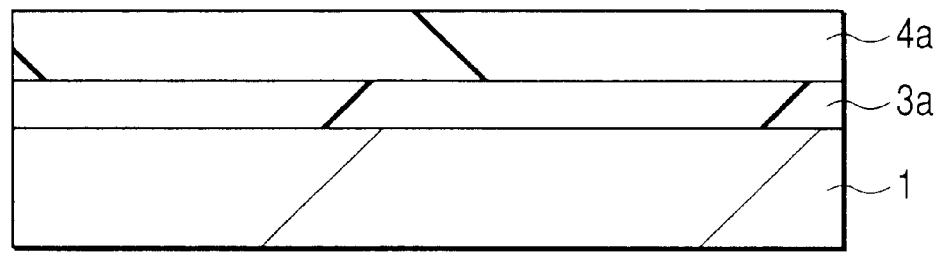
FIG. 4(a) is a cross-sectional view of a principal part during a manufacturing step of a photomask that is another embodiment of the present invention.
Figure 4B:
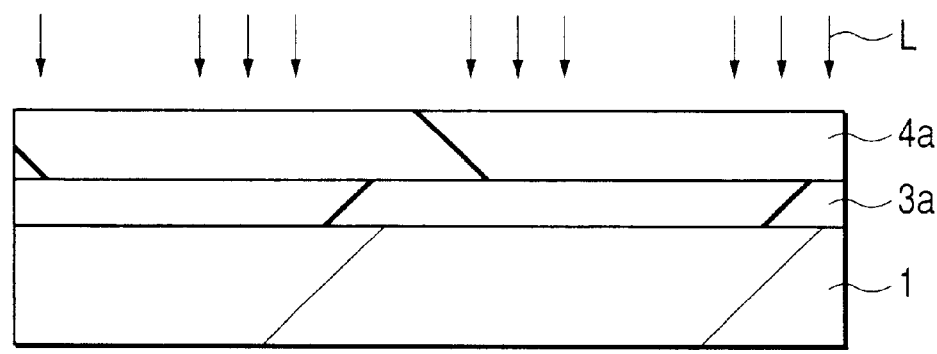
FIG. 4(b) is a cross-sectional view of a principal part during a manufacturing step of a photomask that is another embodiment of the present invention.
Figure 4C:
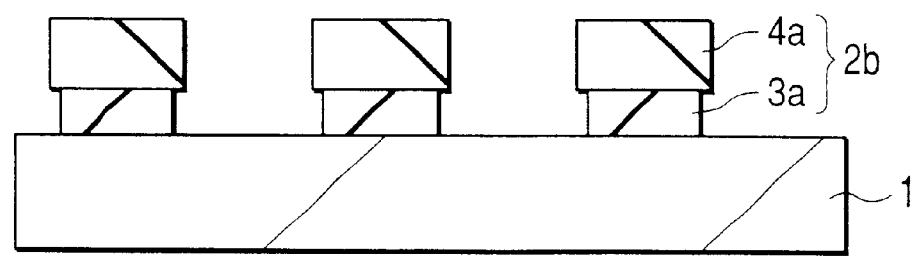
FIG. 4(c) is a cross-sectional view of a principal part during a manufacturing step of a photomask that is another embodiment of the present invention.

This embodiment of resist mask will be described in terms of i-lines (wavelength: 365 nm) that are used as light for exposure by referring to FIGS. 4(a) through 4(c) and FIG. 5. FIGS. 4(a) through 4(c) are cross-sectional views of a principal part of this embodiment of photomask according to the invention, showing different manufacturing steps.

In an experiment, firstly, as shown in FIG. 4(a), a photo-absorptive organic layer 3a for i-lines and a photosensitive resist layer 4a made of novolac resin were sequentially applied on a mask plate 1 (blank). The photo-absorptive organic layer 3a is typically made of polyimide type resin to which a photo-absorptive agent is added. Such a material is known and disclosed in Japanese Patent Laid-open No. 59-93448. On the other hand, the material of the photosensitive resist layer 4a is not limited to novolac resin and the resist layer 4a may alternatively be made of phenol type resin.

Then, as shown in FIG. 4(b), the resist layer 4a was exposed to laser beams L with a wavelength of 365 nm to draw a desired pattern on the resist layer 4a. When laser beams L are irradiated onto a resist film for exposure in order to draw a desired pattern, the influence of reflected light and the thin film interference in the resist layer may become a problem. However, since a photo-absorptive organic layer 3a is formed under the resist layer 4a of this embodiment for the purpose of prevention of reflected light, it was possible to accurately carry out the exposure process without being affected by the influence of reflected light and the thin film interference in the resist layer 4a. Additionally, since laser beams L were used for drawing the pattern, the charge-up problem that may arise when electron beams are used did not occur. As a result, the accuracy of transferring the pattern was greatly improved with this embodiment.

Figure 5:
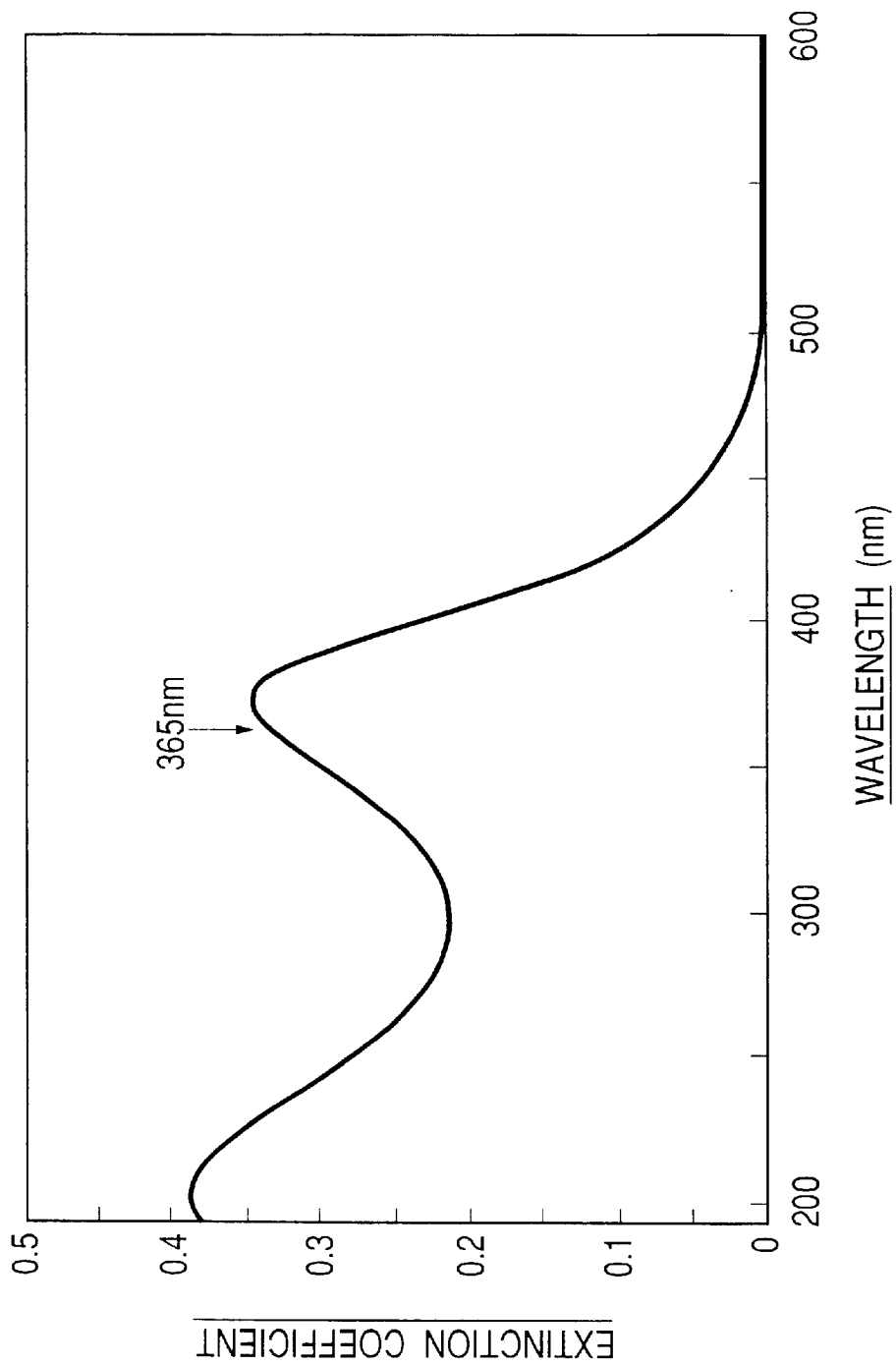
FIG. 5 is a graph illustrating a photo-absorptive characteristic of the light shielding pattern comprising organic film of the photomask of FIG. 4.

Thereafter, as shown in FIG. 4(c), the resist layer 4a was subjected to a development process for patterning by using an aqueous solution of TMAH and the photo-absorptive organic layer 3a was also patterned to produce a half-tone pattern 2b on the first main surface of the mask plate 1. While the photo-absorptive organic layer 3a used in the above experiment showed an attenuation coefficient of about 0.33 relative to i-lines, it is desirable that the photo-absorptive organic layer 3a shows a high attenuation coefficient so that it may show a high light absorbing effect with a small film thickness. When, the photo-absorptive organic layer 3a has a small film thickness, it may be processed with an enhanced accuracy level. FIG. 5 is a graph illustrating the photo-absorptive characteristic of the opaque pattern of a photomask comprising photo-absorptive organic film layers adapted to absorb i-lines. As seen from FIG. 5, the photomask shows a high attenuation coefficient for i-lines with a wavelength of 365 nm. The photo-absorptive organic layer 3a was made to show a film thickness of about 0.2 $\mu$m. The resist layer 4a was made of positive resist. A small phase shift and a high level of accuracy of transfer can be realized when the resist layer 4a is made of a material with which the film edges hardly depends on the pattern dimensions after the development process. The resist layer 4a showed a film thickness of about 0.5 $\mu$m. Under this condition, light is transmitted through the resist layer 4a and the photo-absorptive organic layer 3a by about 4% and the light transmitted through the multi-layer structure of the photo-absorptive organic layer 3a and the resist layer 4a and the light transmitted through the open areas devoid of the multi-layer structure showed a phase difference of 3$\pi$. Thus, a half-tone type phase shifting resist mask MR3 was prepared with a transmittance of 4% relative to i-lines.

A binary mask can be prepared instead of a half-tone type phase shifting mask (and a half-tone pattern can be replaced by an opaque pattern) by raising the film thickness of the photo-absorptive organic layer 3a (typically to about 0.4 $\mu$m). While the embodiment is described above in terms of a resist mask adapted to i-lines, the above method of preparing a resist mask can also be applied to a process of preparing a resist mask adapted to g-lines (with a wavelength of 436 nm). Such a resist mask will be as effective as a resist mask for i-lines.

This embodiment provides the advantages listed earlier for Embodiments 1 and 2.

Embodiment 4

The process of preparing this embodiment of resist mask according to the invention will be described by referring FIGS. 6(a) through 6(e). FIGS. 6(a) through 6(e) are schematic cross sectional views of a principal part of the pattern transferring region of this embodiment of resist mask according to the invention, showing different manufacturing steps.

Figure 6A:
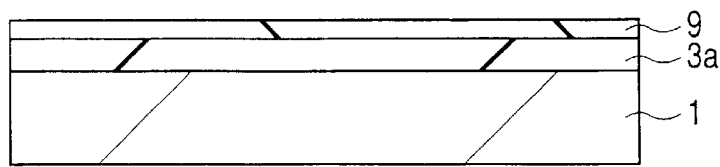
FIG. 6(a) is a cross-sectional view of a principal part of a pattern transferring region during a manufacturing step of a photomask that is another embodiment of the present invention.

Firstly, as shown in FIG. 6(a), a photo-absorptive organic layer 3a is applied on to a mask plate 1 and baked. In an experiment, the photo-absorptive organic layer 3a was made of a polyimide type material that strongly absorbs KrF excimer laser beams as in the case of Embodiment 1. After the baking operation, the photo-absorptive organic layer 3a showed a film thickness of about 0.3 $\mu$m. The baking temperature was about 180° C. The baking temperature needs to be controlled accurately because the solubility of the material of the photo-absorptive organic layer 3a relative to TMAH is highly dependent on the baking temperature.

Figure 6B:
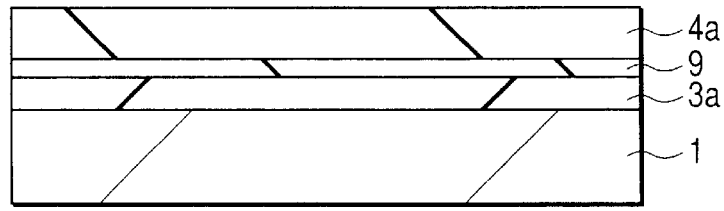
FIG. 6(b) is a cross-sectional view of a principal part of a pattern transferring region during a manufacturing step of a photomask that is another embodiment of the present invention.
Figure 6C:
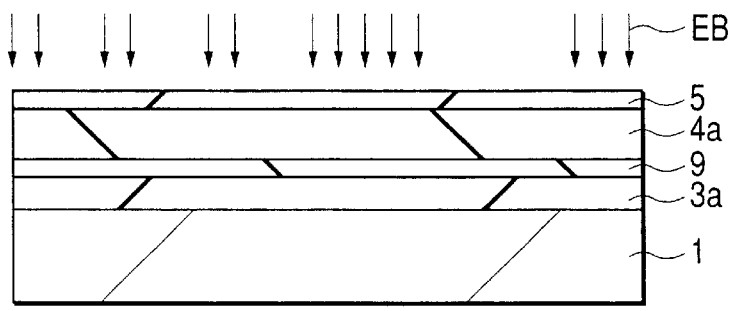
FIG. 6(c) is a cross-sectional view of a principal part of a pattern transferring region during a manufacturing step of a photomask that is another embodiment of the present invention.

Subsequently, nitrogen plasma was irradiated onto the photo-absorptive organic layer 3a in order to make the surface of the latter hardly soluble to TMAH. The nitrogen plasma may be replaced by ultraviolet rays such as VUV rays (wavelength: 157 nm) or the like. As a result, a modified surface barrier layer (to be referred to simple as barrier layer hereinafter) 9 was formed on the photo-absorptive organic layer 3a so as to operate as barrier relative to TMAH. Thereafter, as shown in FIG. 6(b), an electron beam sensing type resist layer 4a was applied onto the barrier layer 9. The electron beams sensing type resist layer 4a was made of acid catalytic reaction type chemical amplification positive resist prepared by using novolac resin as base resin. Then, as shown in FIG. 6(c), an electrically conductive layer 5 was applied and a desired pattern was drawn thereon by means of electron beams EB. The electrically conductive layer 5 was made of a water-soluble material. As a result of providing the conductive layer 5, the charge-up phenomenon could be prevented from taking place during the pattern drawing process using electron beams so that any positional displacement of the drawn pattern could be avoided as in Embodiment 1.

Figure 6D:
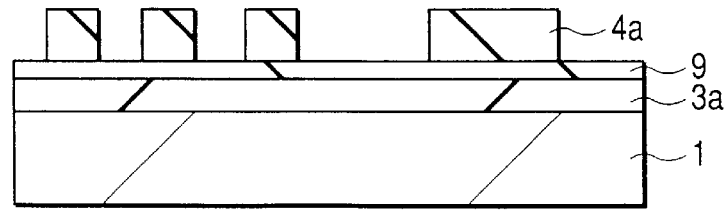
FIG. 6(d) is a cross-sectional view of a principal part of a pattern transferring region during a manufacturing step of a photomask that is another embodiment of the present invention.
Figure 6E:
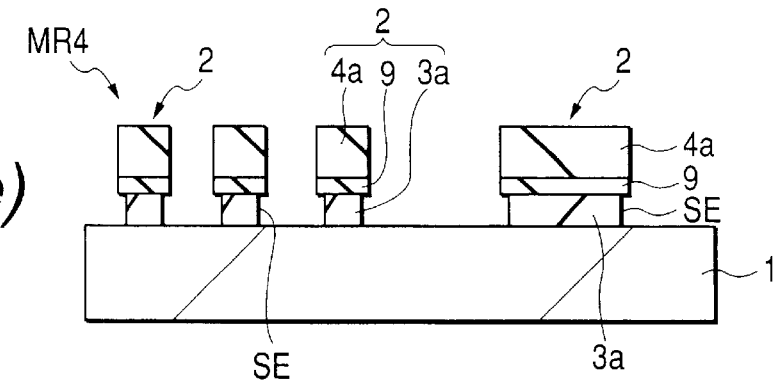
FIG. 6(e) is a cross-sectional view of a principal part of a pattern transferring region during a manufacturing step of a photomask that is another embodiment of the present invention.

Thereafter, the electron beam sensing type resist layer 4a was baked and subjected to a development process using TMAH as developer to pattern the resist layer 4a as shown in FIG. 6(d). Because of the provision of the barrier layer 9 of this embodiment, the etching process of the aqueous solution of TMAH is temporarily stopped by the barrier layer 9 regardless if the pattern is a micro-pattern or a large pattern. Then, as shown in FIG. 6(e), the barrier layer 9 was etched out by the TMAH aqueous solution to pattern the photo-absorptive organic layer 3a. This arrangement of providing a barrier layer is necessary because the process of developing the resist layer 4a can proceed at a varied rate depending on the development area to consequently vary the extent of side etching of the photo-absorptive organic layer 3a. In other words, with this embodiment, the barrier layer 9 formed on the top surface of the photo-absorptive organic layer 3a serves to make the operation of etching the photo-absorptive organic layer 3a start substantially simultaneously at any points on the main surface of the mask plate 1 so that the etching operation proceeds substantially uniformly on the first main surface of the mask plate 1. Thus, the extent of side etching SE of the photo-absorptive organic layer 3a can be made to be substantially uniform in the first main surface of the mask plate 1.

While the TMAH concentration of the developer may be held to a same level from the development of the resist layer 4a to the operation of processing the photo-absorptive organic layer 3a or alternatively varied appropriately. When the barrier layer 9 is partly degraded, the development proceeds quickly in such a part and the dimensional accuracy of the pattern can be degraded there. Therefore, the TMAH concentration may be varied to avoid such a problem. More specifically, the TMAH concentration is reduced when the developer gets to the barrier layer 9. Then, the problem that may arise from the partial degradation of the barrier layer 9 can be avoided to improve the dimensional accuracy of the patterning operation.

As a result, the photo-absorptive organic layer 3a can be patterned satisfactorily to produce a resist mask MR4 having an opaque pattern 2a of a multi-layer structure of a photo-absorptive organic layer 3a and a resist layer 4a. It will be appreciated that the method described above for this embodiment may also be applicable to Embodiments 2 and 3.

This embodiment provides the following advantage in addition to the advantages listed earlier by referring to Embodiments 1 through 3.

As a result of the provision of a barrier layer 9, the photo-absorptive organic layer 3a can be processed uniformly regardless if the pattern is a micro-pattern or a large pattern and hence the extent of side etching of the photo-absorptive organic layer 3a relative to the resist layer 4a can be made to be substantially uniform in the first main surface of the mask plate 1.

Embodiment 5

The process of preparing Embodiment 1 of resist mask was followed for this embodiment except for the resist layer and the development step used for manufacturing the mask. The resist layer 4a of this embodiment is made of a copolymer of poly($\alpha$-methylstyrene-co-($\alpha$-chloro]methylacrylate). An organic developer containing 3-pentanone and diethylmalonate by 50 wt % for each was used.

Figure 7A:
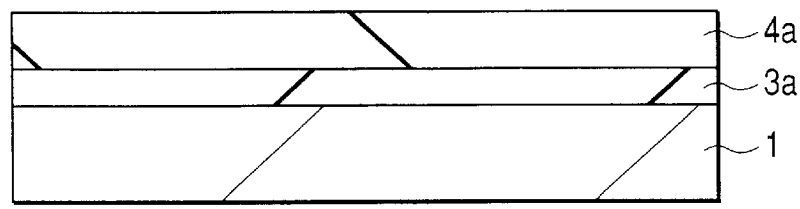
FIG. 7(a) is a cross-sectional view of a principal part of a pattern transferring region during a manufacturing step of a photomask that is another embodiment of the present invention.
Figure 7B:
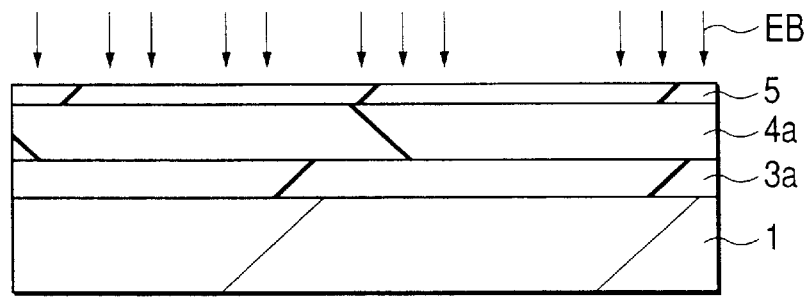
FIG. 7(b) is a cross-sectional view of a principal part of a pattern transferring region during a manufacturing step of a photomask that is another embodiment of the present invention.
Figure 7C:
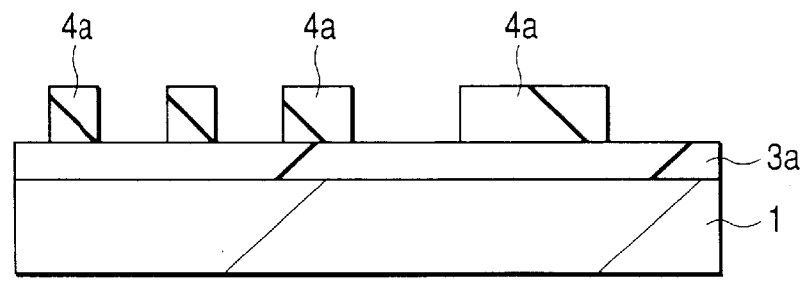
FIG. 7(c) is a cross-sectional view of a principal part of a pattern transferring region during a manufacturing step of a photomask that is another embodiment of the present invention.
Figure 7D:
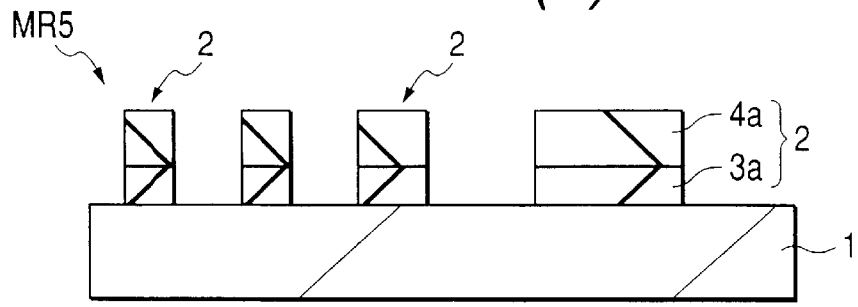
FIG. 7(d) is a cross-sectional view of a principal part of a pattern transferring region during a manufacturing step of a photomask that is another embodiment of the present invention.

The process of manufacturing this embodiment of resist mask proceeds in a manner as described below. Firstly, as shown in FIG. 7(a), a photo-absorptive organic layer 3a is applied on the first main surface of a mask plate 1 and baked. Then, as shown in FIG. 7(b), a resist layer 4a is applied onto the organic layer 3a and baked and subsequently a water soluble electrically conductive layer 5 is applied for the purpose of charge-up prevention. Thereafter, a desired pattern is drawn by means of electron beams BE. After washing off the electrically conductive layer 5 with water, the resist layer 4a is subjected to an organic development process to form the pattern on the photo-absorptive organic layer 3a as shown in FIG. 7(c). With this arrangement, the photo-absorptive organic layer 3a is not etched in the development step. Subsequently, the photo-absorptive organic layer 3a is etched by using a TMAH aqueous solution and also using the pattern of the resist layer 4a as mask to produce a resist mask MR5 having an opaque pattern 2a of a multi-layer structure of a photo-absorptive organic layer 3a and a resist layer 4a as shown in FIG. 7(d). It will be appreciated that the method described above for this embodiment may also be applicable to Embodiments 2 and 3.

While the process of preparing this embodiment includes a number of steps greater than that of the process of preparing Embodiment 1, it provides a remarkable advantage of raising the processing accuracy because the photo-absorptive organic layer 3a is processed independently from the step of developing the resist layer 4a. Particularly, as shown in FIG. 7(d), the processing accuracy can be improved in a case where a relatively large pattern and a relatively minute pattern or a relatively dense pattern and a relatively sparse patterns coexist on a same mask plate 1. As described above by referring to Embodiment 4, when a relatively large pattern and a relatively minute pattern or a relatively dense pattern and a relatively sparse patterns coexist on a same mask plate 1, the time for developing the resist layer 4a and exposing the photo-absorptive organic layer 3a can vary depending on the dimensions and the densities of the patterns to consequently vary the extent of side etching of the photo-absorptive organic layer 3a. However, with this embodiment, the photo-absorptive organic layer 3a can be substantially uniformly etched in the first main surface of the mask plate 1 because the photo-absorptive organic layer 3a is patterned after the completion of the step of developing the resist layer 4a.

Embodiment 6

A method of forming an opaque pattern by dry etching will be described for this embodiment by referring to FIGS. 8(a) through 8(d). FIGS. 8(a) through 8(d) are schematic cross sectional views of a principal part of the pattern transferring region of this embodiment of resist mask according to the invention, showing different manufacturing steps.

Figure 8A:
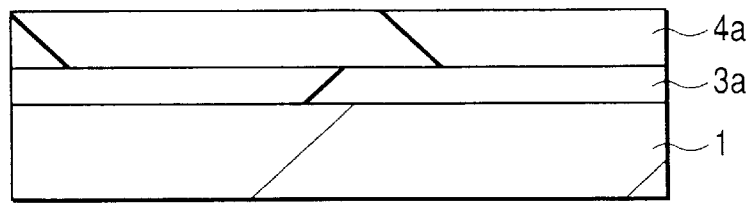
FIG. 8(a) is a cross-sectional view of a principal part of a pattern transferring region during a manufacturing step of a photomask that is another embodiment of the present invention.

In an experiment, firstly a photo-absorptive organic layer 3a was applied to the first main surface of a mask plate 1 and baked and then an electron beam sensing type resist layer 4a was applied thereon as shown in FIG. 8(a). A polyaniline type material that strongly absorbs KrF excimer laser beams was used for the photo-absorptive organic layer 3a. The photo-absorptive organic layer 3a was electrically conductive. A photo-absorptive agent had been added to the photo-absorptive organic film 3a in order to make the latter absorb KrF excimer laser beams. After the baking, the photo-absorptive organic layer 3a showed a film thickness of about 0.3 $\mu$m. The baking temperature was 250° C. An acid catalytic reaction type chemical amplification positive resist layer prepared by using phenol resin as base resin was used for the electron beam sensing type resist layer 4a. Novolac resin or acrylic resin may alternatively be used for the base resin.

Figure 8B:
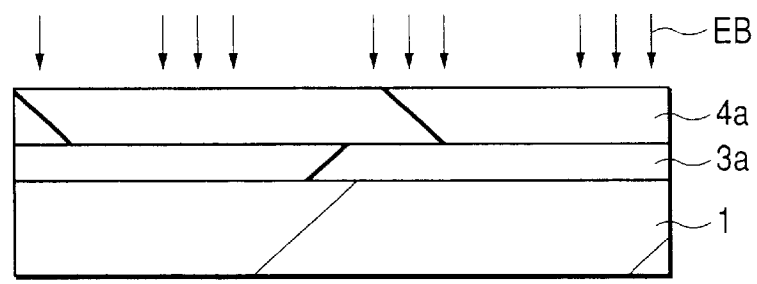
FIG. 8(b) is a cross-sectional view of a principal part of a pattern transferring region during a manufacturing step of a photomask that is another embodiment of the present invention.
Figure 8C:
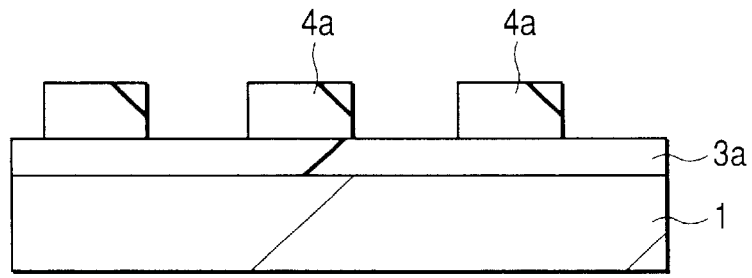
FIG. 8(c) is a cross-sectional view of a principal part of a pattern transferring region during a manufacturing step of a photomask that is another embodiment of the present invention.
Figure 8D:
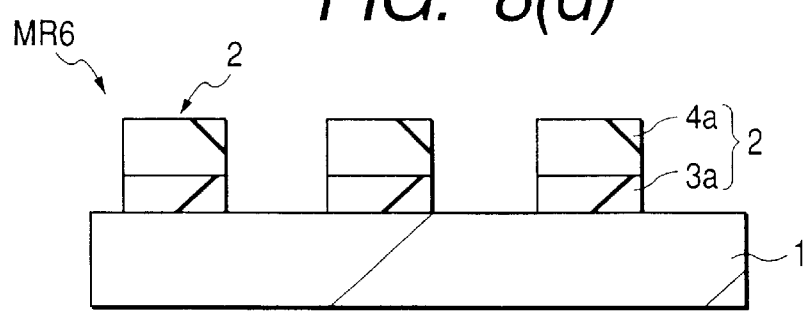
FIG. 8(d) is a cross-sectional view of a principal part of a pattern transferring region during a manufacturing step of a photomask that is another embodiment of the present invention.

Then, as shown in FIG. 8(b), a desired pattern was drawn by means of electron beams EB. Since the photo-absorptive organic layer 3a was an electrically conductive layer, the charge-up problem was prevented from occurring during the operation of drawing the pattern by means of electron beams and hence no positional displacement of the drawn pattern due to charge-up appeared. Subsequently, the electron beam sensing type resist layer 4a was baked and developed by using a TMAH aqueous solution to produce a pattern of the resist layer 4a on the photo-absorptive organic layer 3a as shown in FIG. 8(c). Thereafter, as shown in FIG. 8(d), the photo-absorptive organic layer 3a was patterned by dry etching, using the pattern of the resist layer 4a as mask to produce a resist mask MR6 having an opaque pattern 2 of a multi-layer structure of a photo-absorptive organic layer 3a and a resist layer 4a.

This embodiment provides the following advantage in addition to the advantages listed above by referring to Embodiments 1 through 3.

As the photo-absorptive organic layer 3a is formed by highly anisotropic etching, it can be made to show substantially vertical sides that are free from side etching. Thus, the obtained opaque pattern 2 is dimensionally highly accurate. The resist layer 4a can be made to show an appropriate etching rate ratio relative to the photo-absorptive organic layer 3a to further improve the dimensional accuracy of the opaque pattern 2a when the resist layer 4a is made to contain an inorganic substance such as silicon (Si).

Embodiment 7

Figure 9A:
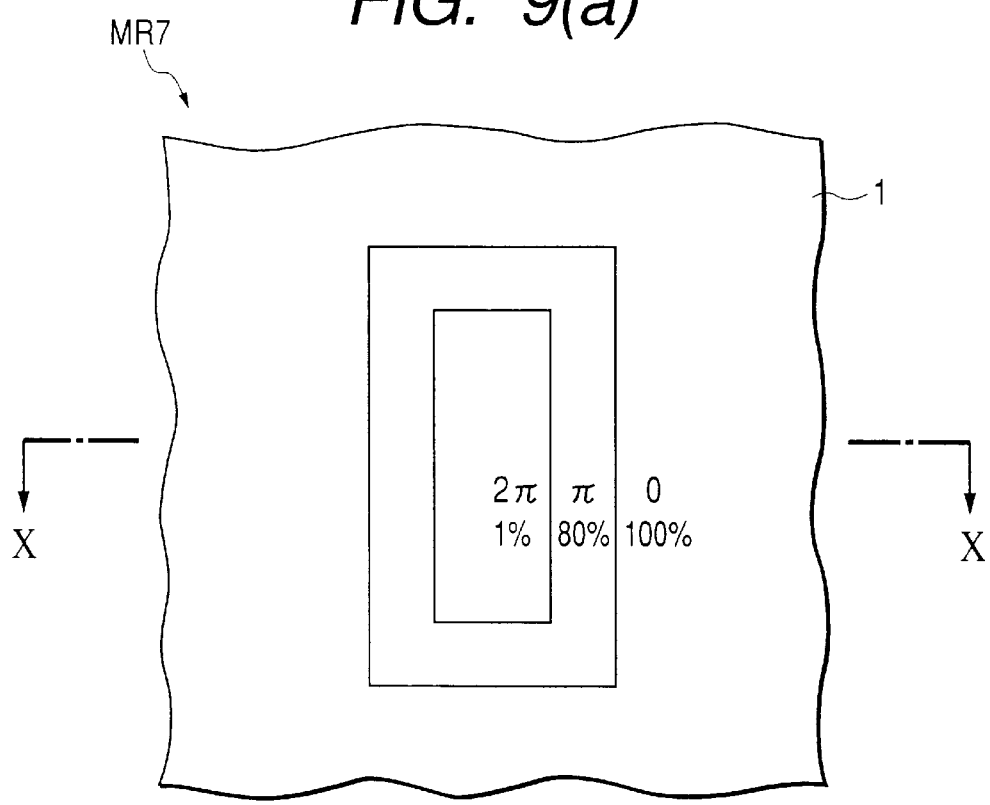
FIG. 9(a) is a plan view of a pattern transferring region of a photomask that is another embodiment of the present invention.
Figure 9B:
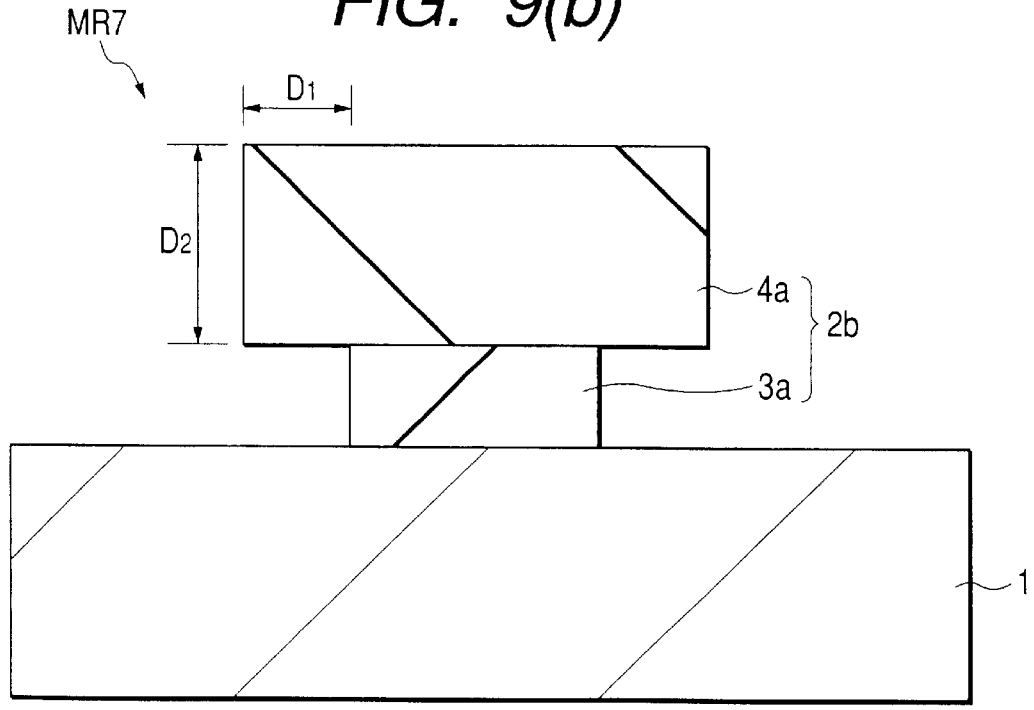
FIG. 9(b) is a cross-sectional view taken along line X—X in FIG. 9(a).

This embodiment is a modified half-tone type phase shifting resist mask MR7. FIG. 9(a) is a schematic plan view of the pattern transferring region of this embodiment of half-tone type phase shifting resist mask. FIG. 9(b) is a cross-sectional view of the embodiment of FIG. 9(a) taken along line X—X in FIG. 9(a). In FIG. 9(a), 0, π(180°) and 2 π(360°) indicate the respective phase differences of the beams transmitted through corresponding respective areas. The percentages refer to the transmittances of the corresponding respective areas relative to the incident beams.

A half-tone pattern 2b of a multi-layer structure comprising a photo-absorptive organic layer 3a and a resist layer 4a is formed on the first main surface of a mask plate 1. Note that the horizontal dimensions of the photo-absorptive organic layer 3a is made smaller than those of the resist layer 4a to produce an overhang with a width D1 along the outer peripheral edges of the resist layer 4a by regulating the duration of the development process.

The resist layer 4a was made to show a film thickness of $\pi/(2(n-1))$, where π is the wavelength of light for exposure and n is the refractive index of the resist layer 4a relative to light for exposure. Thus, the phase of light for exposure transmitted through the overhang of the resist layer 4a is inverted by π relative to that of light for exposure transmitted through the open areas that are free from the resist layer 4a. Additionally, the phase of light for exposure transmitted through the overhang of the resist layer 4a is inverted by δ relative to that of light for exposure transmitted through the area (attenuation area) where the resist layer 4a is horizontally laid on the photo-absorptive organic layer 3a.

Typically only about 1% of incident light for exposure is transmitted through the area where the resist layer 4a is horizontally laid on the photo-absorptive organic layer 3a. On the other hand, about 80% of incident light for exposure is transmitted through the overhang of the resist layer 4a. Furthermore, almost 100% of incident light for exposure is transmitted through the open area of the mask plate 1 that is free from the photo-absorptive organic layer 3a and the resist layer 4a.

Figure 10:
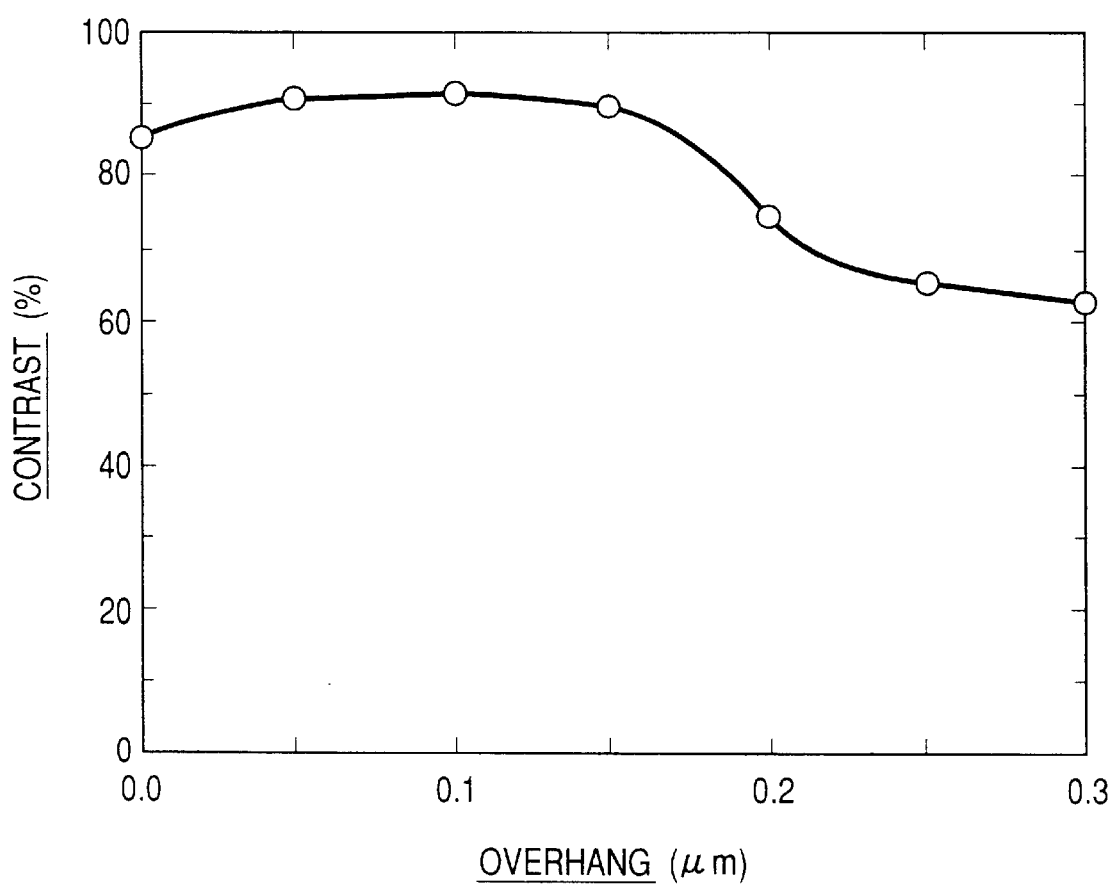
FIG. 10 is a graph illustrating exposure contrast obtained when the photomask of FIGS. 9(a) and 9(b) is used.

FIG. 10 is a graph illustrating the contrast of light obtained when the embodiment of resist mask of FIGS. 9(a) and 9(b) is used. The dimension of the overhang in FIG. 10 is determined on the half-tone type phase shifting resist mask MR7. In other words, if the reduction factor of the exposure apparatus is M, the dimension of the overhang on the wafer is 1/M. In an experiment, a stepper with a lens having a reduction factor of ⅕ was used. Then, 0.1 μm in FIG. 10 corresponds to 0.02 μm on the wafer. An improvement of contrast was observed when the overhang on the half-tone type phase shifting resist mask MR7 was between 0.05 μm and 0.15 μm if compared with a resist mask having no overhang to prove the effect of a rimmed half-tone type resist mask. After studying the effect of the exposure and transfer operation on resolution, it was found that an improvement of contrast can be achieved when the resist layer 4a has a film thickness d between $\lambda/(4(n-1))$ and $3\pi/(4(n-1))$ (e.g., phase difference of the light for exposure is π).

This embodiment provides the advantage as described below in addition to the advantages listed above by referring to Embodiments 1 through 3.

As the phase of light for exposure transmitted through the overhang of the resist layer 4a is inverted by 180° relative to that of light transmitted through the area where the resist layer 4a is horizontally laid on the photo-absorptive organic layer 3a and the open area that is free from the photo-absorptive organic layer 3a and the resist layer 4a, the contract of the profiled zone of the pattern can be improved by the effect of phase inversion if the lateral surfaces of the photo-absorptive organic layer 3a are side-etched to a slight extent. Therefore, the horizontal dimensional variances of the transferred pattern can be minimized to improve the dimensional accuracy of the transferred pattern.

Embodiment 8

Figure 11A:
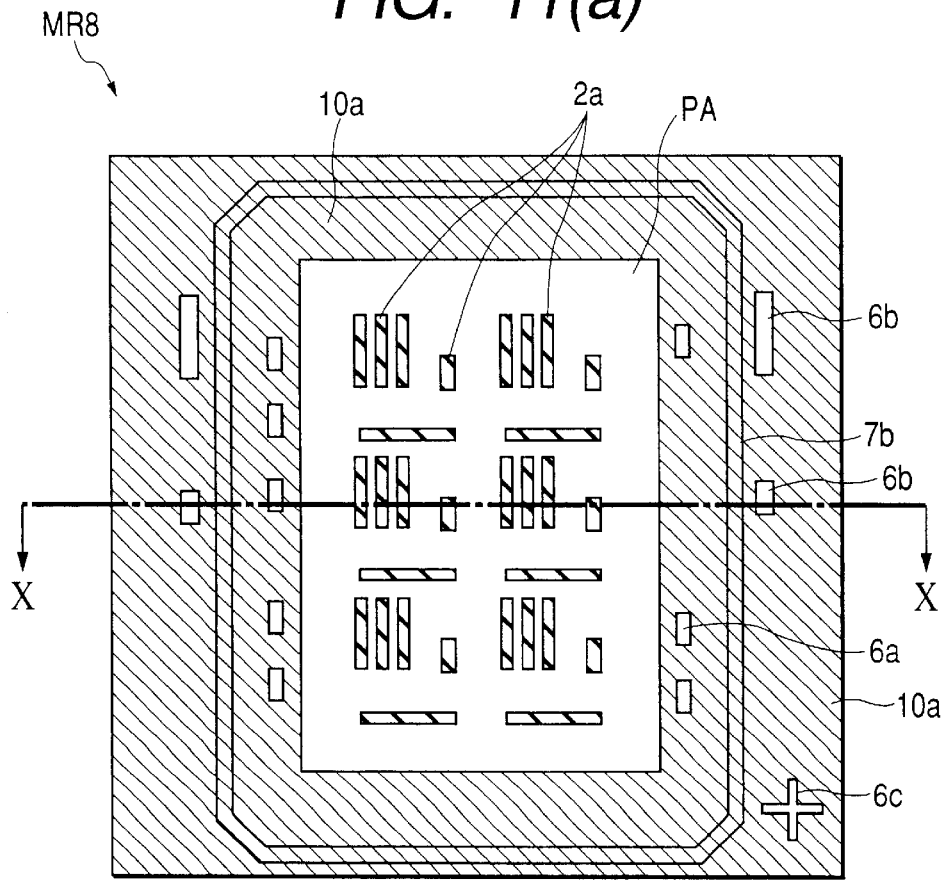
FIG. 11(a) is an entire plan view of a concrete example of a photomask that is one embodiment of the present invention.
Figure 11B:
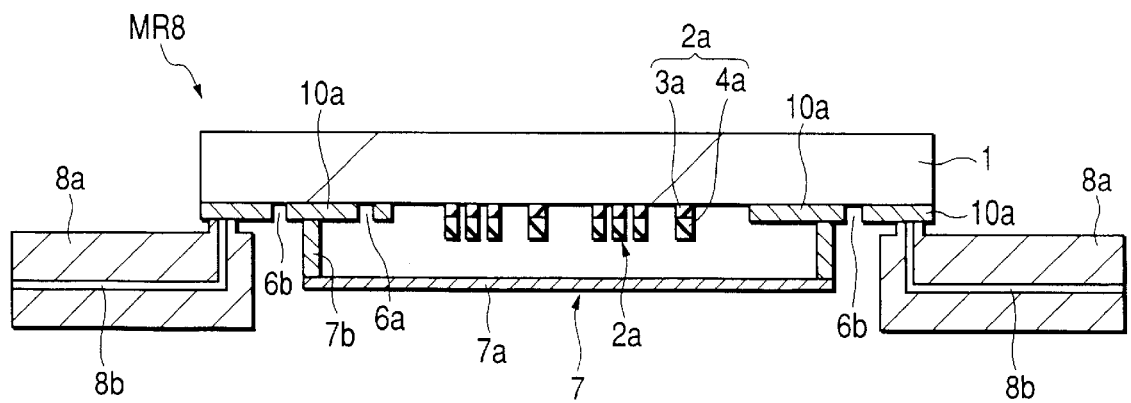
FIG. 11(b) is a cross-sectional view taken along line X—X in FIG. 11(a) when the photomask is set at an exposure apparatus.

This embodiment represents a resist mask having a modified structure. FIGS. 11(a) and 11(b) schematically illustrates the resist mask MR8 of this embodiment. FIG. 11(a) is a schematic plan view of the resist mask MR8 of this embodiment, and FIG. 11(b) is a schematic cross sectional view of the resist mask MR8 FIG. 11(a) taken along line X—X in FIG. 11(a) and mounted on the exposure apparatus.

Of this embodiment, the peripheral region of the first main surface of the mask plate 1 is substantially entirely covered by an opaque pattern 10a typically made of metal film such as chromium(Cr)film. However, it should be noted that the material of the opaque pattern 10a is not limited to chromium and may be replaced by any other appropriate material. Examples of materials that can be used for the opaque pattern 10a include high melting point metals such as tungsten, molybdenum, tantalum and titanium, compounds including nitrides such as tungsten nitride and high melting point suicides such as tungsten silicide ($WSi_x$) and molybdenum silicide ($MoSi_x$) and multi-layer films formed by using any of them.

The resist mask MR8 of the embodiment is adapted to be reused after removing the opaque pattern 2a made of an organic material and cleansing the mask plate 1. Therefore, the opaque pattern 10a is preferably made of a material that makes it to be hardly striped and highly wear-resistant. The use of high melting point metal such as tungsten is preferable for the opaque pattern 10a because such metal is highly oxidation-resistant and wear-resistant and makes the opaque pattern 10a to hardly come off.

Transparent patterns 6a that are produced by partly removing the opaque pattern 10a serve as wafer alignment marks to be used for aligning the different layers on the wafer as in Example 1. Transparent patterns 6b that are also produced by partly removing the opaque pattern 10a serve as reticle alignment marks to be used for accurately locating the resist mask MR8. A transparent patterns 6c that is produced by partly removing the opaque pattern 10a in the form of a cross near a corner of the mask plate 1 is used as drawing alignment mark for positionally regulating the transparent patterns 6a operating as wafer alignment marks, the transparent patterns 6b operating as reticle alignment marks and the opaque patterns 2a to be used for transferring integrated circuit patterns. The pellicle 7 is bonded to the opaque pattern 10a with the bonding surface of its frame section 7b directly held in contact with the opaque pattern 10a. In the case of this resist mask MR8, the photo-absorptive organic layer 3a and the resist layer 4a are not formed in areas where it contacts with the frame section 7b of the pellicle 7, the reticle stage 8 and the reticle transporting system. As described earlier, if the photo-absorptive organic layer 3a and the resist layer 4a are formed in those contact areas, they may come off when they are brought into contact with the frame to produce foreign objects. Therefore, the photo-absorptive organic layer 3a and the resist layer 4a are not formed in those areas to prevent any production of foreign objects.

In some exposure apparatus, the reticle alignment marks and other marks are detected by means of laser beams from a halogen lamp, a red diode, a red semiconductor laser or a helium (He)-neon (Ne) laser. An opaque member to be used for light for exposure that has a multi-layer structure comprising a photo-absorptive organic layer 3a and a resist layer 4a cannot satisfactorily block such beams because of their wavelengths so that it may be difficult to detect various marks including reticle alignment marks with a sufficient degree of contrast. Thus, with this embodiment, those marks are formed by partly removing the opaque pattern that is made of metal. Thus, the opaque member can satisfactorily block such beams and hence various marks including reticle alignment marks can be detected with a sufficient degree of contrast.

Now, the process of manufacturing the resist mask MR8 of this embodiment will be described by referring to FIGS. 11(a), 11(b) and 12(a) through 12(d). FIGS. 12(a) through 12(d) are schematic cross sectional views of the embodiment of photomask of FIGS. 11(a) and 11(b), showing different manufacturing steps.

Figure 12A:
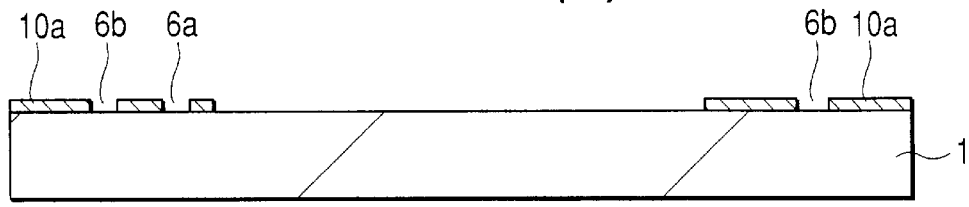
FIG. 12(a) is a cross-sectional view during a manufacturing step of a photomask of FIGS. 11(a) and 11(b).

Firstly, as shown in FIG. 12(a), a metal film typically made of chromium (Cr) is deposited on the first main surface of the mask plate 1 by sputtering and patterned by etching to produce transparent patterns 6a through 6c. More specifically, the transparent patterns 6a through 6c are formed by partly removing the plane and frame-like opaque pattern 10a (it is noted that the transparent pattern 6c is not shown in FIG. 12(a)).

Figure 12B:
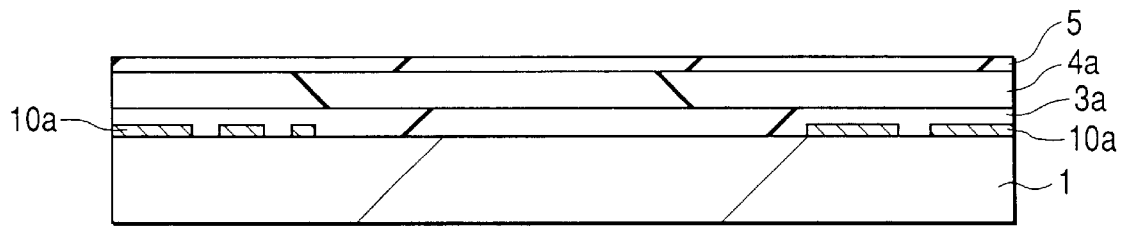
FIG. 12(b) is a cross-sectional view during a manufacturing step of a photomask of FIGS. 11(a) and 11(b).

Then, as shown in FIG. 12(b), a photo-absorptive organic layer 3a is applied onto the first main surface of the mask plate 1 and baked and an electron beam sensing type resist layer 4a is applied thereon and baked as in Embodiment 1. Thereafter, an electrically conductive layer 5 is applied onto the resist layer 4a.

Figure 12C:
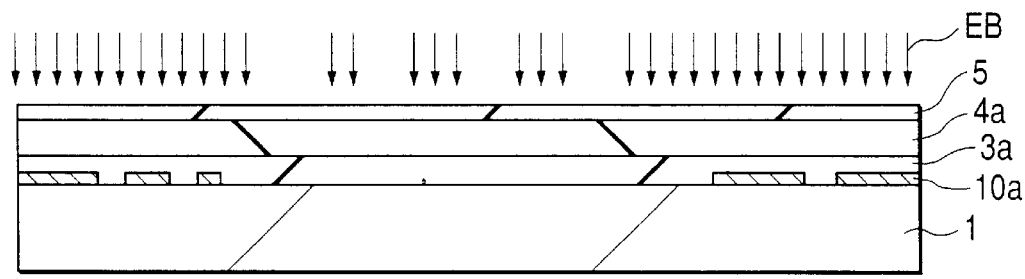
FIG. 12(c) is across-sectional view during a manufacturing step of a photomask of FIGS. 11(a) and 11(b).

Subsequently, as shown in FIG. 12(c), a desired circuit pattern is drawn by means of electron beams EB. At this time, the position of the transparent pattern 6c (see FIG. 11) designed as alignment mark for the pattern drawing operation is referred to in order to correct the positional displacements, if any. The operation of detecting the position of the alignment mark for the pattern drawing is important because, without such an alignment mark, positional displacements can occur among the circuit pattern, the reticle alignment marks (transparent patterns 6b) and the wafer alignment marks (transparent patterns 6a).

Figure 12D:
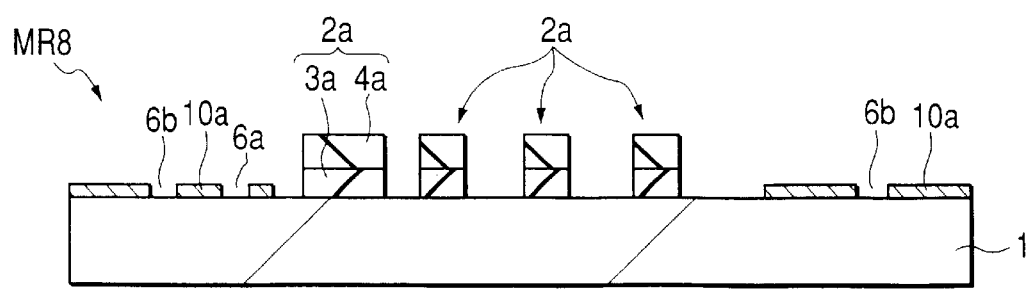
FIG. 12(d) is a cross-sectional view during a manufacturing step of a photomask of FIGS. 11(a) and 11(b).

Then, the electron beam sensing type resist layer 4a is baked and developed by means of a developer containing TMAH. Thereafter, the resist layer 4a is patterned in a manner as shown in FIG. 12(d). When developing the pattern, the photo-absorptive organic layer 3a is also processed to produce the pattern of the photo-absorptive organic layer 3a. As a result, the resist mask MR8 having an opaque pattern 2a of a multi-layer structure comprising the photo-absorptive organic layer 3a and the resist layer 4a is produced. While the wafer alignment marks (transparent patterns 6a) are produced by partly removing the opaque pattern 10a made of metal film in the above description, they may alternatively produced from the opaque pattern comprising the photo-absorptive organic layer 3a and the resist layer 4a.

This embodiment provides the advantage as described above in addition to the advantages listed earlier by referring to Embodiments 1 through 3.

As the reticle alignment marks are formed by partly removing the opaque pattern 10a that is made of metal film, the location of the resist mask MR8 can be reliably detected in the exposure apparatus adapted to detect reticle alignment marks by using beams from a halogen lamp, a red diode, a red semiconductor laser or a He—Ne laser.

Embodiment 9

This embodiment is characterized in that the pattern transferring region of the resist mask has both opaque patterns made of organic film and opaque patterns made of metal. Japanese Patent Application No. 2000-206729 (filed on Jul. 7, 2000) discloses a technique of preparing a mask with a pattern transferring region containing in part thereof opaque patterns made of organic film.

Figure 13A:
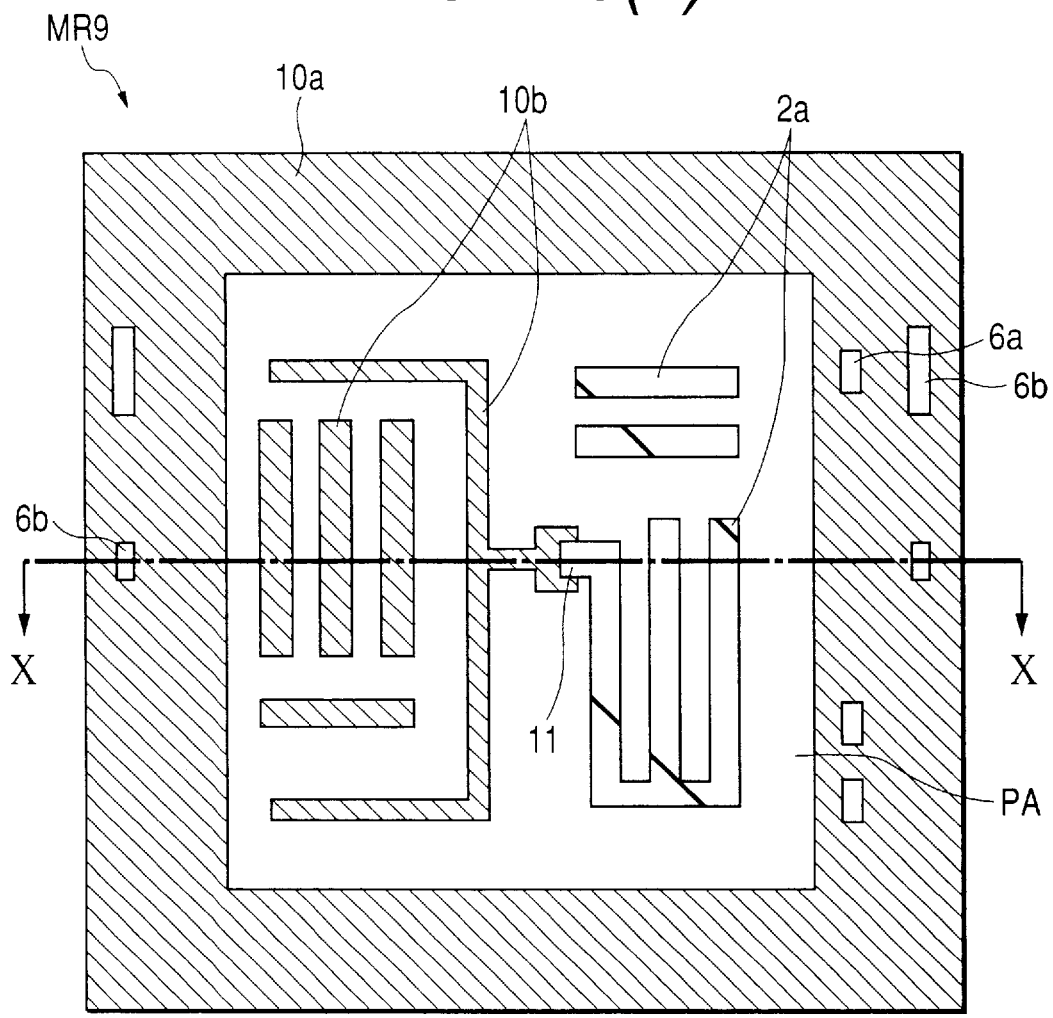
FIG. 13(a) is a entire plan view of a concrete example of a photomask that is another embodiment of the present invention.
Figure 13B:
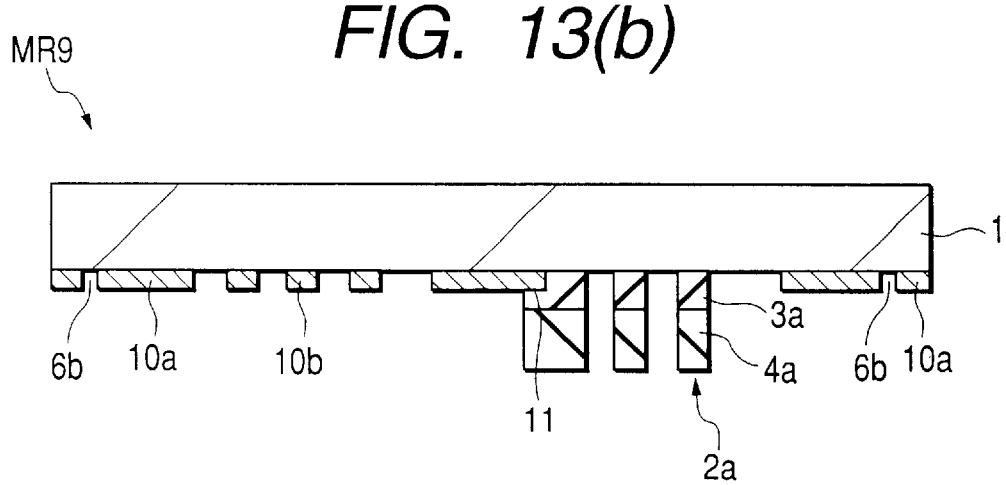
FIG. 13(b) is a cross-sectional view taken along line X—X in FIG. 13(a).

FIG. 13(a) is a schematic plan view of the resist mask MR9 of this embodiment of the invention and FIG. 13(b) is a schematic cross sectional view of the embodiment of FIG. 13(a) taken along line X—X in FIG. 13(a). Opaque patterns 2a, 10b for integrated circuits are formed in the pattern transferring region of the first main surface of the mask plate 1. Both opaque pattern 10a and the opaque patterns 10b are made of metal film. The opaque patterns 10b are formed in the step of forming the opaque pattern 10a, which is described earlier by referring to Embodiment 8. The opaque patterns 10b made of metal film are provided as general purpose patterns or circuit patterns that are scarcely subjected to modifications, whereas the opaque patterns 2a made of organic film are provided as those to be used optionally or circuit patterns that are frequently subjected to modifications. The opaque pattern 2a comprising two organic film layers are formed after forming the opaque patterns 10a, 10b that are made of metal film.

In an experiment, after using the resist mask MR9 prepared in a manner as described above, the opaque pattern 2a of organic film was removed in a manner as described earlier by referring to Embodiment 1 and subsequently a new opaque pattern 2a was formed from organic film to make it show a desired pattern. Since the opaque patterns 10b made of metal film can be used after the regenerating process, the number of steps and the drawing time could be remarkably reduced in the regenerating process. By taking the misalignment that may arise in the pattern drawing process into consideration, the pattern 2a of organic film and the connection section 11 preferably have large dimensions relative to the other areas and include overlap margins.

This embodiment provides the following advantages in addition to those listed earlier by referring to Embodiments 1 through 3 and 8.

(1) Since the opaque patterns to be used for a pattern transfer operation include both those made of metal film and those made of organic film, the number of steps and the drawing time necessary for forming opaque patterns in the regenerating process are greatly reduced to consequently reduce the overall duration of the process of regenerating the resist mask MR9. Thus, the time necessary for manufacturing products by transferring patterns, using the resist mask, can be further curtailed.

(2) Since the resist mask MR9 comprises opaque patterns made of metal film and those made of organic film for a pattern transfer operation, it is highly durable and serves to curtail the time necessary until the shipment.

While the present invention is described above in great detail by referring to preferred embodiments, the invention is by no means limited to those embodiments, which may be altered and/or modified in various different ways without departing from the scope of the invention.

For example, while the opaque patterns have a multi-layer structure comprising a photo-absorptive organic layer and a resist layer in any of Examples 1 through 9, the present invention is by no means limited thereto and the opaque patterns may alternatively have a single layer structure comprising only a photo-absorptive organic layer. More specifically, after patterning the photo-absorptive organic layer, using a resist layer as mask, the resist mask may be removed.

While ordinary illumination is used for exposure in any of Examples 1 through 9 above, the present invention is by no means limited thereto and modified illumination may alternatively be used in a manner as described earlier.

While a stepper is used for the exposure process in any of Examples 1 through 9 above, the present invention is by no means limited thereto and a scanning exposure process using a scanner may alternatively be used in a manner as described earlier.

While the present invention is described above mainly in terms of techniques for transferring an integrated circuit pattern onto a wafer, which is the technological field where the inventors of the present invention are deeply involved, the present invention is by no means limited thereto and the present invention is applicable to a method of manufacturing a disk where a predetermined pattern needs to be transferred onto a disk by exposing it to light and also to a method of manufacturing a liquid crystal display or a micro-machine.

Thus, in short, the present invention provides the following major advantage.

According to the invention, it is now possible to prepare a resist mask with a satisfactory level of resolution even when light with a wavelength of 200 nm or more is used for exposure by forming an attenuation pattern or an opaque pattern on a mask plate, said attenuation pattern or the opaque pattern comprising a first organic layer adapted to attenuate or block light for exposure, whichever appropriate, and a photosensitive second organic layer.

What is claimed is:

1. A method of manufacturing a photomask comprising:
   providing a mask substrate transparent to an exposure light;
   depositing a first organic layer on the mask substrate for absorbing the exposure;
   depositing a second organic layer having a photosensitive effect on said first organic layer;
   exposing a desired pattern in said second organic layer;
   developing said exposed second organic layer thereby patterning said second organic layer; and
   patterning said first organic layer by using said patterned second organic layer as a masking layer thereby forming an attenuation pattern.

2. The method of manufacturing a photomask according to claim 1, further comprising:
   forming at least one first mark pattern by forming an opaque pattern of a metal layer in an outer peripheral region of a pattern transferring region of said mask plate and by cutting a portion of the opaque pattern of the metal layer located in the peripheral region to form a light transmitting pattern for aligning at least the organic layers, and a second mark pattern comprising another portion of the opaque pattern of the metal layer in the outer peripheral region around the pattern transferring region of said mask plate; and
   aligning a reticle with the second mark pattern thereby exposing said desired pattern onto said second organic layer.

3. The method of manufacturing a photomask according to claim 1, further comprising depositing a conductive layer on said second organic layer, and thereafter a step of exposing said desired pattern by using an electron beam.

4. The method of manufacturing a photomask according to claim 1,
   wherein said first organic layer has an electric conductivity.

5. The method of manufacturing a photomask according to claim 4,
   wherein said first organic layer contains polyaniline.

6. The method of manufacturing a photomask according to claim 1, further comprising a step of exposing said desired pattern by using a laser beam.

7. The method of manufacturing a photomask according to claim 1, wherein said first organic layer absorbs the exposure light having wavelength of 200 nm or more.

8. The method of manufacturing a photomask according to claim 7,
   wherein said exposure light is one of a KrF excimer laser beam, an i-line of an ultra high pressure mercury lamp, and a g-line of an ultra high pressure mercury lamp.

9. The method of manufacturing a photomask according to claim 1, further comprising a step of forming said first organic layer by a coating method.

10. The method of manufacturing a photomask according to claim 1, wherein the step of developing said second organic layer involves a step of patterning said first organic layer.

11. The method of manufacturing a photomask according to claim 1, further comprising diminishing a developing rate of a developer applied to a surface of said first organic layer after the step of depositing said first organic layer and before the step of depositing said second organic layer.

12. The method of manufacturing a photomask according to claim 11, wherein the diminishing step involves a step of forming a barrier layer between said first organic layer and said second organic layer thereby diminishing said development rate.

13. The method of manufacturing a photomask according to claim 1, wherein the step of patterning said first organic layer involves a dry etching method.

14. The method according to claim 1, wherein said mask substrate is made of transparent fused quartz.

* * * * *